United States Patent [19]
Saitoh et al.

[11] Patent Number: 6,046,461
[45] Date of Patent: Apr. 4, 2000

[54] SEMICONDUCTOR INTEGRATED CIRCUIT DEVICE

[75] Inventors: Yutaka Saitoh; Yuji Yamamoto, both of Chiba; Hirokazu Ikeda, Tsukuba, all of Japan

[73] Assignee: Seiko Instruments R&D Center Inc., Japan

[21] Appl. No.: 08/866,620

[22] Filed: May 30, 1997

[51] Int. Cl.[7] .................................................. H01L 31/12
[52] U.S. Cl. .............................. 250/551; 257/83; 327/514
[58] Field of Search ..................... 250/551; 257/80–82, 257/84, 446, 458; 327/514

[56] References Cited

U.S. PATENT DOCUMENTS

| | | | |
|---|---|---|---|
| 3,914,137 | 10/1975 | Huffman et al. | 257/82 |
| 4,122,479 | 10/1978 | Sugawara et al. | 250/551 |
| 5,189,500 | 2/1993 | Kusunoki | 257/84 |
| 5,679,964 | 10/1997 | Kobayashi et al. | 257/83 |

*Primary Examiner*—Stephone B Allen
*Attorney, Agent, or Firm*—Adams & Wilks

[57] ABSTRACT

An IC is configured by using a circuit form comprising a CMOS and also a new current inverter element, thereby to reduce current consumption of ICs having a function of converting an output from a photodiode or the like to a voltage and a function of amplifying the output.

36 Claims, 18 Drawing Sheets

FIG. 5A
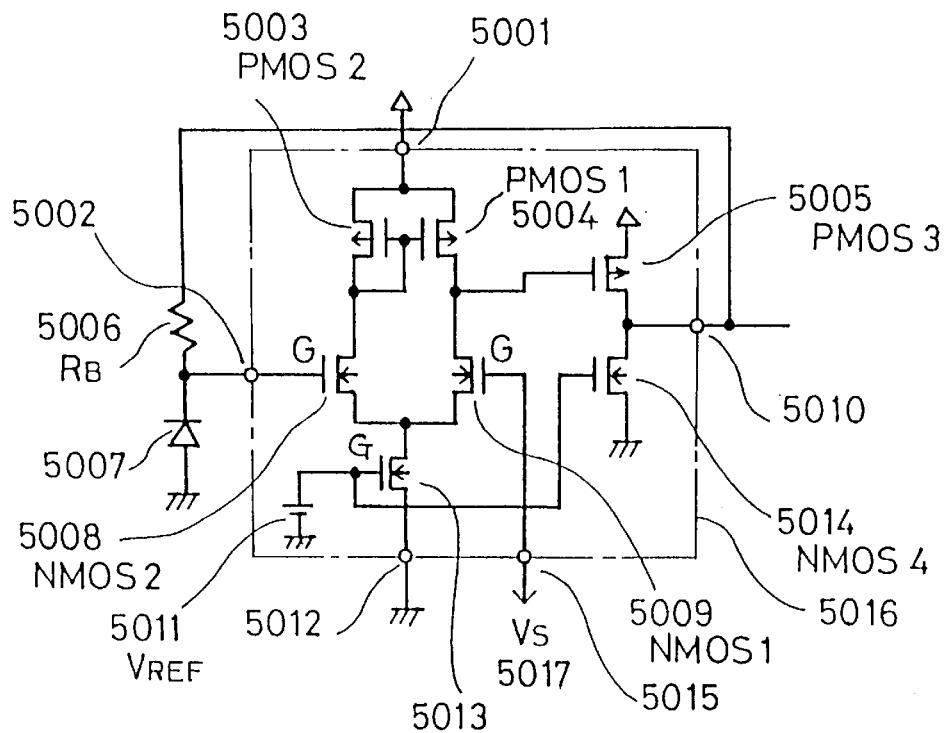
FIG. 5B
FIG. 5C
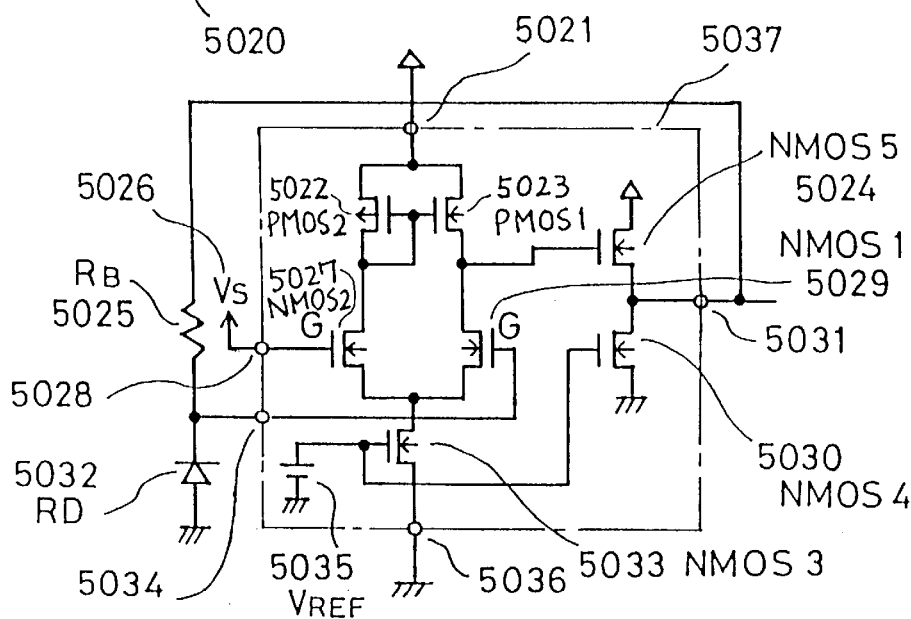

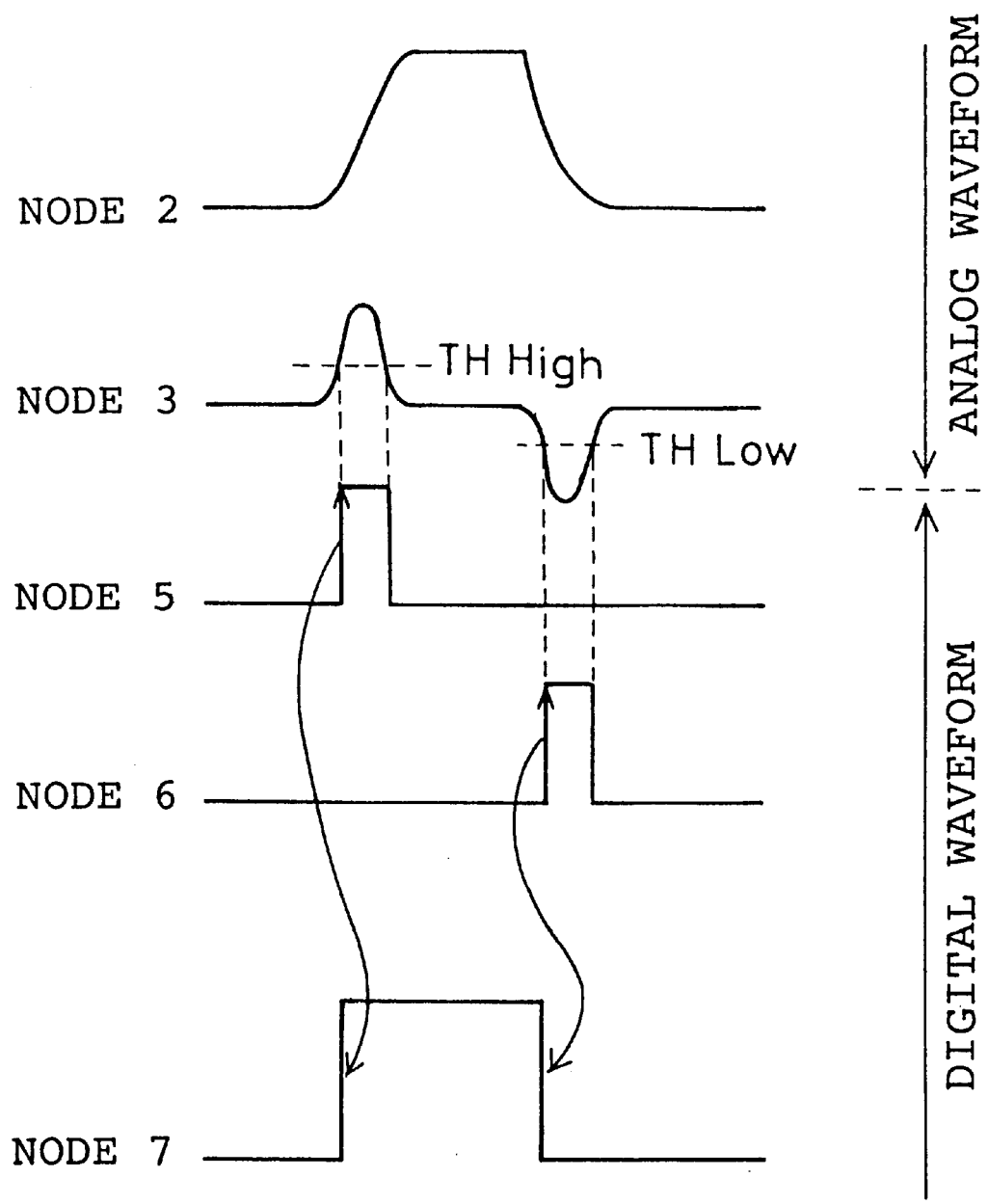

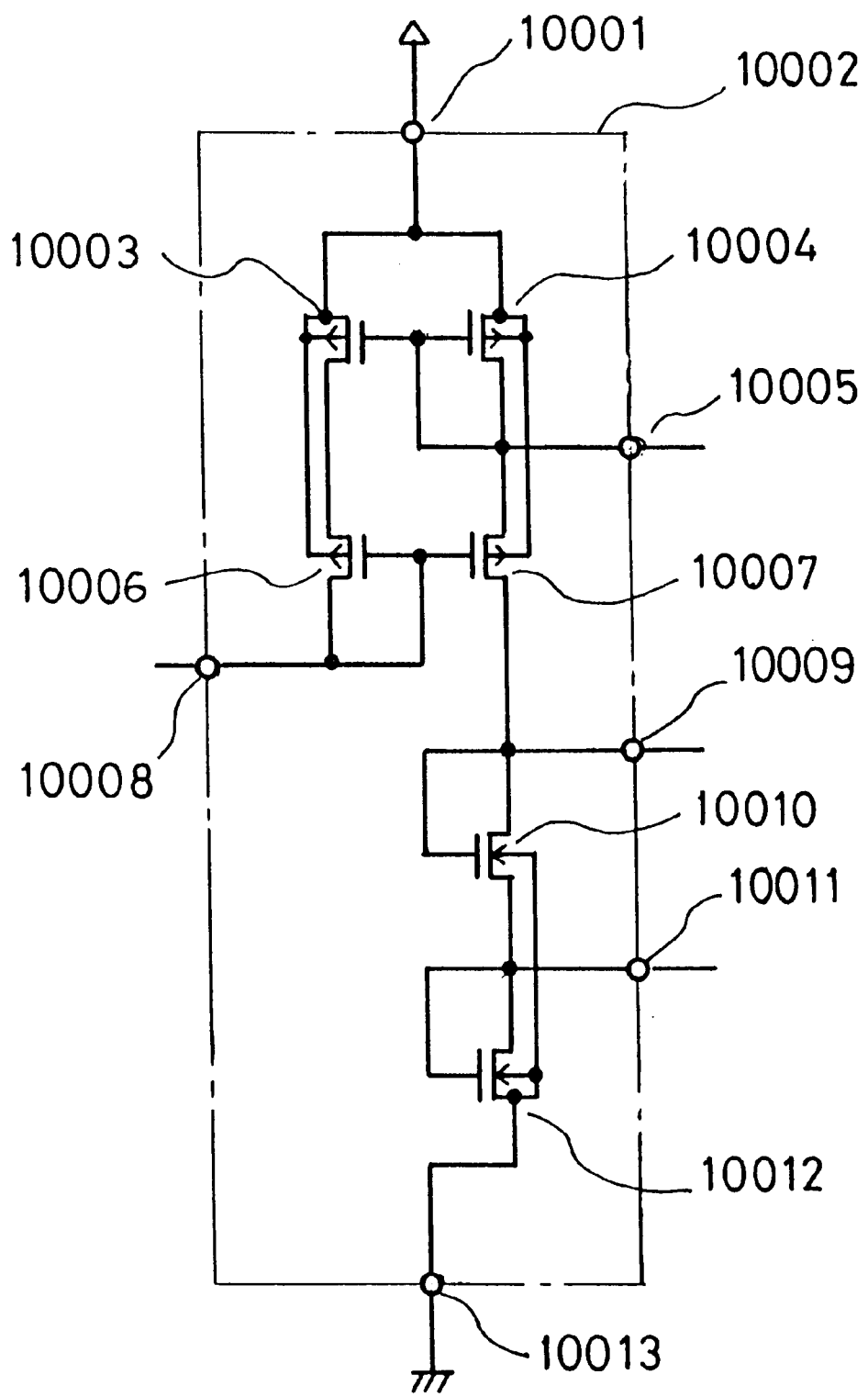
F I G. 1 0

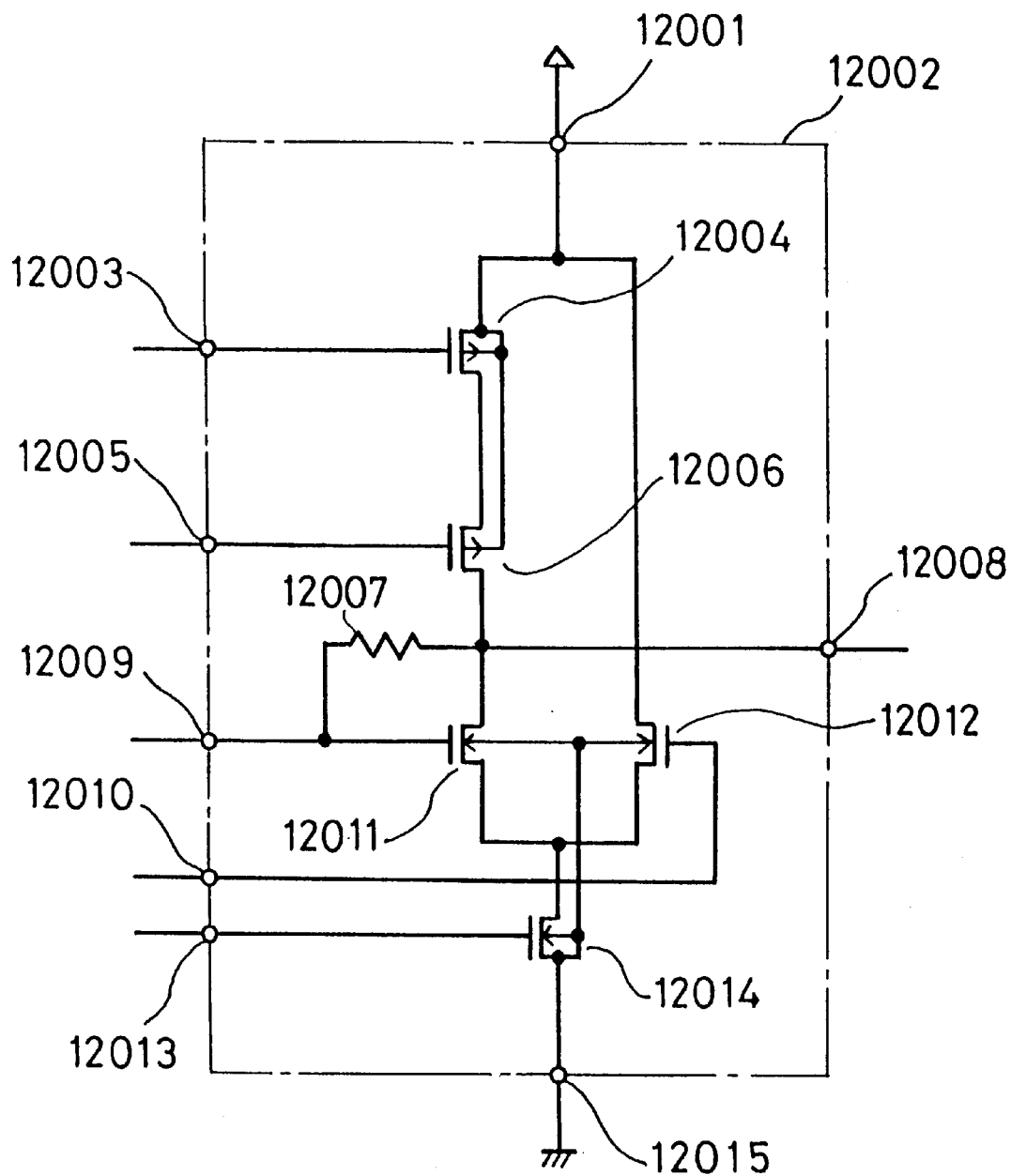
F I G. 1 2

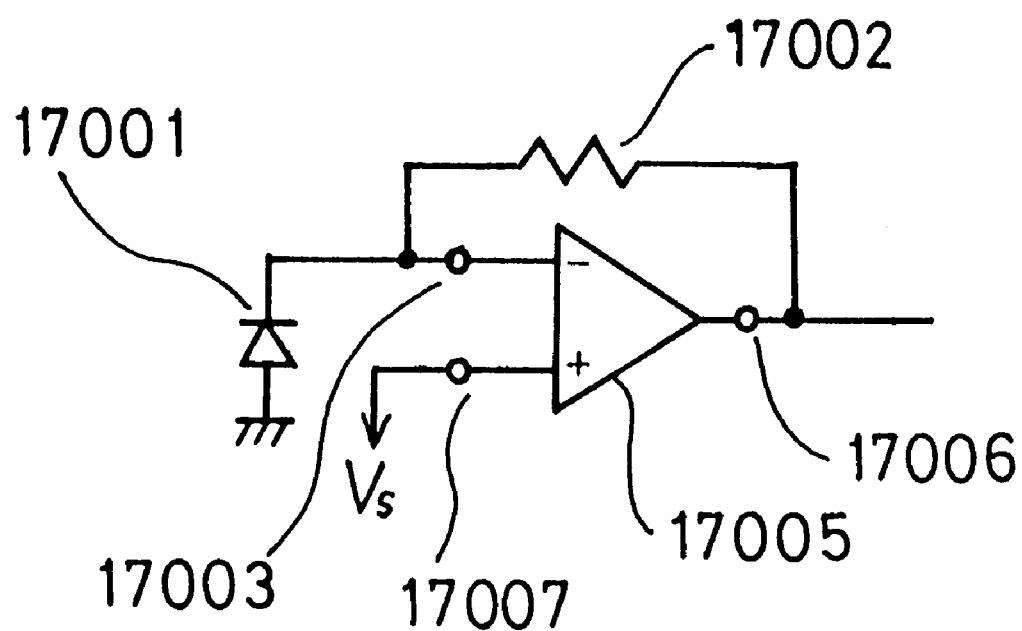
F I G. 1 7 ately describing the circuit configuration of a
SEMICONDUCTOR INTEGRATED CIRCUIT DEVICE

BACKGROUND OF THE INVENTION

The present invention relates to the circuit configuration of a semiconductor integrated circuit device, and more particularly, to a circuit configuration of a semiconductor device having a function for converting an output from a sensor, such as a photodiode and, more specifically, for converting a current output to a voltage (I-V conversion), a function for impedance conversion (transimpedance conversion), an amplifying functions, or several types of computing function, and provides a technology for a new high performance and low cost semiconductor integrated circuit device.

FIG. 17 is a circuit diagram showing one example of an I-V conversion circuit. A photodiode (a photodetector, a photodetector and a photodiode are sometimes abbreviated as PD) 17001 is connected in series to an input terminal [−(minus)] 17003 of a differential amplifier (described as an amplifier, a preamplifier, a front-end amplifier, or an operational amplifier) 17005 and is in series with an output terminal 17006 through a feedback resistance (sometimes described as RF). A reference voltage Vs is applied to an input terminal [+(plus)] 17007 thereof.

FIG. 18 is a view of a circuit 18007 showing a conventional type of amplifier (a differential amplifier) and is an example based on the conventional technology of an internal circuit of the differential amplifier (amplifier) shown in FIG. 17 described above.

The conventional type of amplifier has input terminals (−, +) 18004, a Vdd terminal 18001, an output terminal (Vout) 18005, a GND terminal 18008, and a plurality of other elements such as a constant current source 18002, a PNP type of bipolar transistor 18003, and an NPN type of bipolar transistor 18006 or the like, and has a circuit configuration as shown in the figure.

The conventional amplifier circuit has a problem in that current consumption can not be reduced (a base current has to be always flown therein) because it comprises the bipolar transistors as described above. For instance, even if a signal is in the base band at a Vdd of 5 V, the consumed current is around 8 mA when the amplifier is operated at a speed at which signals in the band of 16 MHz can be handled, and around 32 mA, around 4 times larger than that in the former case, when the amplifier is operated at a speed at which signals in the band of 32 MHz can be handled. There is another problem in the conventional type of amplifier in that it is difficult to reduce an operational voltage of an entire circuit to 3 V or below because the amplifier is also driven by a base current (a large $V_{BEON}$ voltage is required).

SUMMARY OF THE INVENTION

Several measures as described below are taken in the present invention to solve the problems as described above.

As a first measure, a differential amplifier is built based on the CMOS configuration comprising a P channel MOS transistor (PMOS) and an N channel MOS transistor (NMOS) in place of a bipolar transistor, and a semiconductor integrated circuit device (IC) is built using the amplifier.

As a second measure, an output stage of the CMOS type of differential amplifier has two layers of NMOS.

As a third measure, an IC is built using a current inverter element (described later in detail) in place of an differential amplifier.

The current inverter is configured so that it can execute a summing operation or subtracting operation with not only the transimpedance function but also with a wired system.

As a fourth measure, a cascode connection using a PMOS is formed in a bias portion of a constant current in the current inverter.

As a fifth measure, an NMOS for inverting a current polarity in the current inverter comprises a plurality of transistors each having a different W/L ratio.

As a sixth measure, a capacity element is inserted in series with to an amplifier for I-V conversion in the IC, circuits thereafter are processed with a differentiation signal, and the signal is converted back (demodulated) to a digital signal in the final stage thereof.

As a seventh measure, a light-link cable module for an optical fiber is formed by using the IC.

BRIEF DESCRIPTION OF DRAWINGS

FIG. 5A is a circuit diagram showing the first example of configuration of a the CMOS type of amplifier circuit section 5016 in the amplifier IC according to Embodiment 1 of the present invention;

FIG. 5B is a circuit diagram showing one example of a configuration of the reference voltage (Vref) circuit section in the CMOS type of amplifier circuit section in the amplifier IC according to Embodiment 1 of the present invention;

FIG. 5C is a circuit diagram showing the second example of configuration of the CMOS type of amplifier circuit section 5037 in the amplifier IC according to Embodiment 1 of the present invention;

FIG. 9 is a simulated view showing signal voltage waveforms in each node in FIG. 8 of the amplifier IC according to Embodiment 3 of the present invention;

FIG. 10 is a circuit diagram showing the bias control circuit section 10002 in the amplifier IC according to Embodiment 3 of the present invention;

FIG. 12 is a circuit diagram showing the differential amplifier 12002 constituting the stage 2 circuit section and stage 3 circuit section in the amplifier IC according to Embodiment 3 of the present invention;

FIG. 17 is a circuit diagram showing one example of the I-V converting circuits.

DETAILED DESCRIPTION OF THE INVENTION

Figure 1:
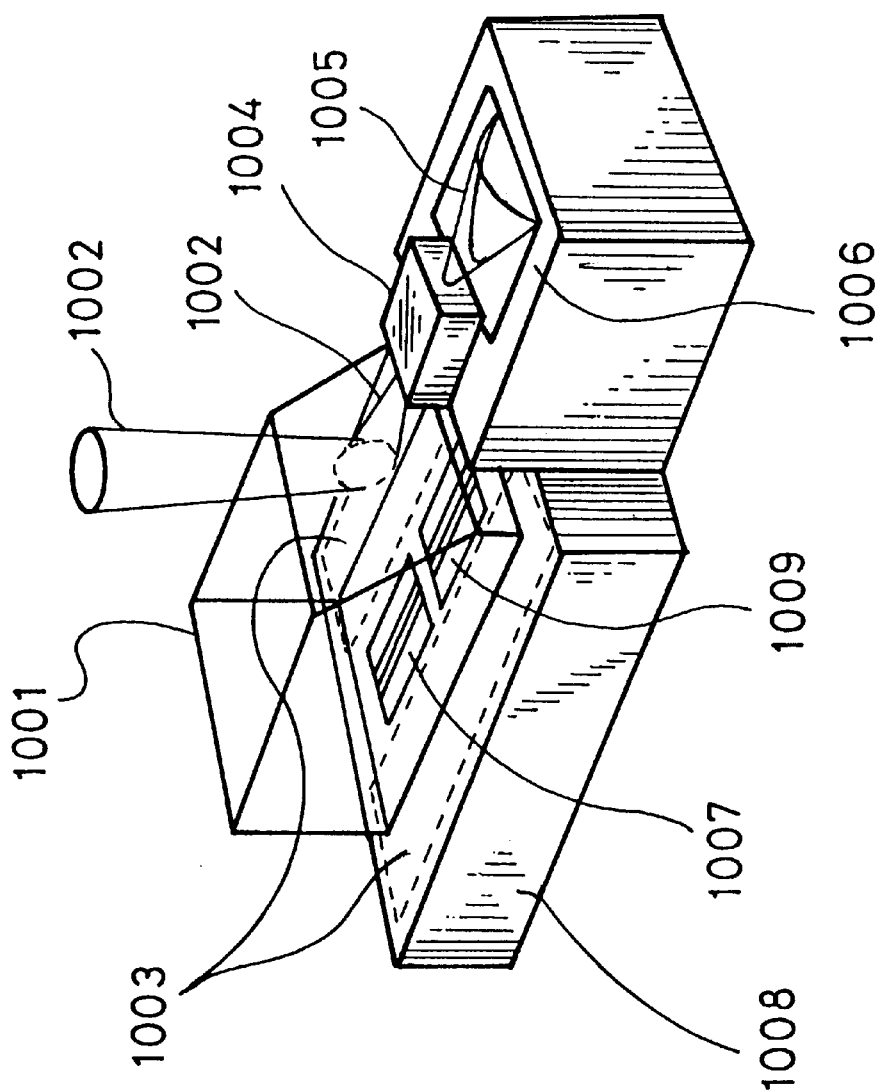
FIG. 1 is an appearance view showing a light pickup module using the semiconductor integrated circuit device (described as an amplifier IC according to the present invention hereinafter) according to Embodiment 1 of the present invention.

FIG. 1 is an appearance view showing a light pickup-module using a semiconductor integrated circuit device (described as an amplifier IC according to the present invention hereinafter) 1008 according to Embodiment 1 of the present invention.

The light pickup module is a section for the reading of data (described as a light pickup, a laser pickup, a pickup module or the like) from a digital disc using a laser diode (described as a semiconductor laser or a LD or the like) 1004 used in a CD-ROM drive, a laser disk drive, or a DVD (Digital Video Disc) drive or the like. A laser beam 1002 emitted from a laser diode 1004 to a front side (to the side of a prism 1001) is reflected off the slant surface of the prism 1001 to direct to the upper side (a direction of the surface of a disc), the light reflected by dots (digital data) in the disc returns to the prism to be reflected in the prism, and the lights from a plurality of PDs (photodiodes) (PD array) formed and arrayed on the same semiconductor substrate as that on which an amplifier IC 1008 according to the present invention is provided go into a Rear PD array section 1007 as well as to a Front PD array section 1009. Although a spot size (FIG. 2, 2009) of incident lights to the Rear PD section and the Front PD section is described later, the lights are distributed according to the depth (a distance between a pickup and a disc) of focus as well as to displacement of the direction (Track). The laser diode 1004, at the same time, emits a laser beam 1005 backward, and another PD 1006 in FIG. 1 plays a roll of monitoring the laser beam in the back how strong (laser power) the beam is. The PD for monitoring laser power and the amplifier IC according to the present invention are placed by contacting one side of the PD with that of the IC so that the positional relation with the prism is appropriate therebetween as shown in FIG. 1.

Figure 2A:
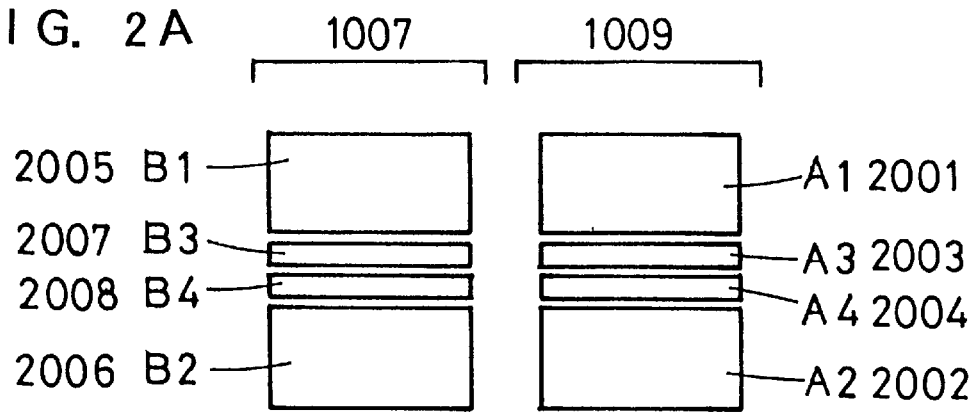
FIGS. 2A–2D are a plan view of a PD array arranged on the amplifier IC according to the present invention in Embodiment 1 of the present invention.

FIG. 2A to 2D are plan views each showing a PD array arranged on the amplifier IC according to Embodiment 1 of the present invention. FIG. 2A shows the plurality of PDs having the Front PD array section 1009 comprising a PD2001 described as A1, a PD2002 as A2, a PD2003 as A3, and a PD2004 as A4 and the Rear PD array section 1007 comprising a PD2005 as B1, a PD2006 as B2, a PD2007 as B3, and a PD2008 as B4.

Figure 2B:
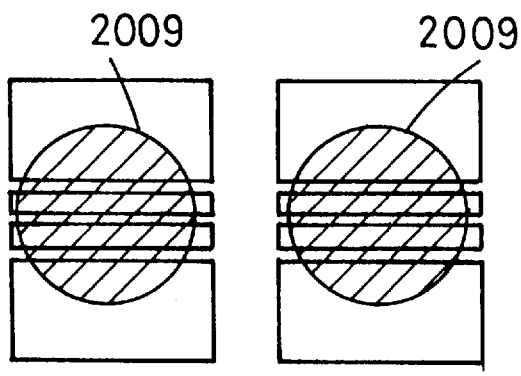

FIG. 2B shows a state in which the spot 2009 of the laser beam returning by being reflected off the disc as described above is irradiated uniformly onto the Front PD array section as well as the Rear PD array section. Namely, this figure shows that the focus described above is just in the required state.

Figure 2C:
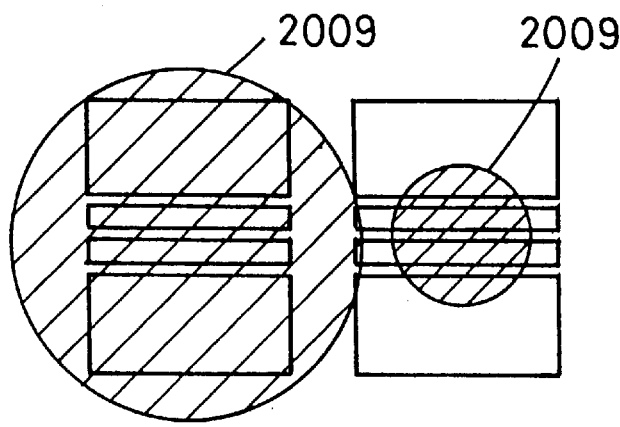
Figure 2D:
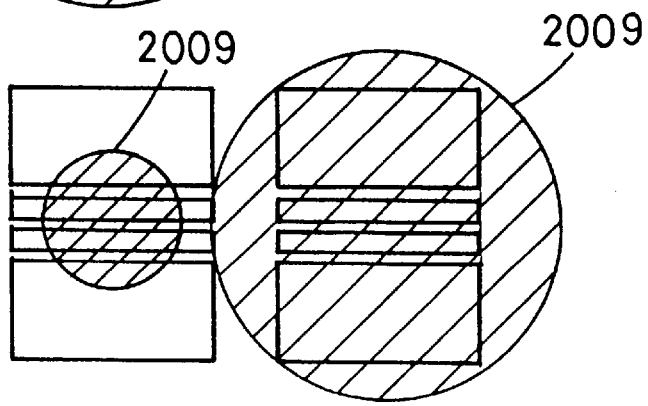

In contrast, in FIG. 2C, the beam spot is irradiated more strongly onto the Rear PD array section, because, for instance, (which depends on setting a positional relation between PD arrays, and herein terms of Rear and Front are used for the description thereof) the focus herein is too close (the disc and the pickup are close to each other), and the focus in FIG. 2D is too far in this case.

Assuming that a signal identifying the focus is described as a Focus signal herein, computation of output signals from the PDs as A1 to B4 is executed as follows:

Focus signal=(A1+A2+B3+B4)−(B1+B2+A3+A4)

and the Track signal is described as follows:

Track signal=(A2+A4+B1+B3)−(A1+A3+B2+B4)

The digital signal (RF signal) which is important herein is described as follows:

RF signal=(A1+A2+A3+A4)+(B1+B2+B3+B4)

In any of the cases, an output signal (current) from a PD is subjected to I-V conversion, and is further computed as described above (computing for adding numbers is generally described as addition and similarly computing for subtracting a number from another number is called subtraction, but to avoid confusion between the terms, it is assumed herein that addition for signals is described as summing operation and especially subtraction for signals is described as subtracting operation because the subtraction for signals means that a difference therebetween is computed), and the above processed output signal has to be outputted as a voltage, so that the amplifier IC according to the present invention is designed so as to enable performance of functions required for the above processes.

Figure 3:
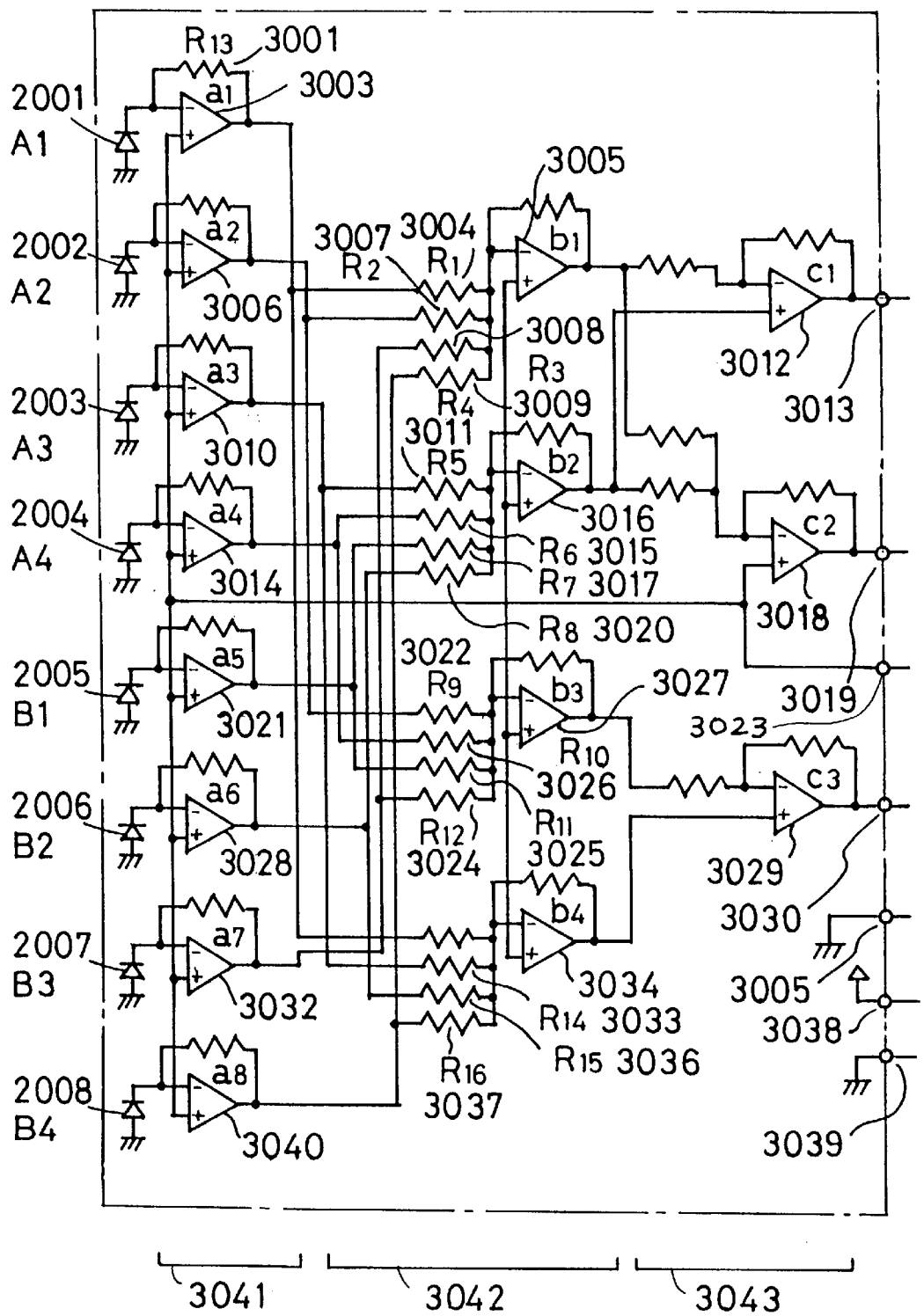
FIG. 3 is a system block diagram showing a circuit of the amplifier IC 3002 according to Embodiment 1 of the present invention.

FIG. 3 is a system block diagram showing a circuit of an amplifier IC 3002 according to Embodiment 1 of the present invention. The amplifier IC 3002 has an I-V converting stage 3041 comprising a CMOS type (described later) of amplifier (difference amplifier) circuit sections $a_1$ (3003), $a_2$ (3006), $a_3$ (3010), $a_4$ (3014), $a_5$ (3021), $a_6$ (3028), $a_7$ (3032), and $a_8$ (3040) in succession to PDs in A1 to B4 through feedback resistances $R_B$ respectively; a summing operation stage 3042 comprising amplifier circuit sections $b_1$ (3005), $b_2$ (3016), $b_3$ (3027), and $b_4$ (3034) through resistances for voltage sum-computation $R_1$ (around 20 k Ω may be sufficient) (3004), $R_2$ (3007), $R_3$ (3008), $R_4$ (3009), $R_5$ (3011), $R_6$ (3015), $R_7$ (3017), $R_8$ (3020), $R_9$ (3022), $R_{10}$ (3026), $R_{11}$ (3025), $R_{12}$ (3024), $R_{13}$ (3031), $R_{14}$ (3033), $R_{15}$ (3036), and $R_{16}$ (3037); a substracting operation/summing operation and output buffer stage 3043 comprising amplifier circuit sections $c_1$ (3012), $c_2$ (3018), and $c_3$ (3029); a Focus signal output terminal 3013; an RF signal output terminal 3019; a $V_5$-voltage input terminal 3023; a Track signal output terminal 3030; a GND (ground) terminal 3035; a Vdd terminal 3038; and a Vss terminal 3039 (it is provided as required. In a case where an analog GND and a digital GND are provided separately therefrom, a plurality of ground terminals may be prepared. The same configuration may be required for the Vdd terminal). The amplifier IC has the configuration as shown in the figure, whereby in output from each of the amplifier circuit sections $b_1$ to $b_4$ in the summing operation stage 3042, not only outputs from the PDs are summed but also the polarities (positive/negative) thereof are inverted. Namely, each output is as follows:

b₁ output;–(A1+A2+B3+B4)

b₂ output;–(A3+A4+B1+B2)

b₃ output;–(A2+A4+B1+B3)

b₄ output;–(A1+A3+B2+B4)

Further, in the subtracting operation/summing operation/output buffer stage 3043, the subtracting operation and summing operation are executed as required for computing the Focus signals and the Track signals, and also inverses the polarities thereof again. Then, each output is finally obtained as follows:

$c_1$ output (Focus signal); (A1+A2+B3+B4)–(B1+B2+A3+A4)

$c_2$ output (RF signal) (A1+A2+A3+A4)+(B1+B2+B3+B4)

$c_3$ output (Track signal); (A2+A4+B1+B3)–(A1+A3+B2+B4)

Namely, by inverting and amplifying signals in two stages (although the gain of the amplifier is 1), even if the CMOS type of amplifier is used, it is not required to execute measures for canceling an offset voltage like in a case where the CMOS type of amplifier is operated by non-inverting amplification. In addition, computing for signals can also be executed as described above. Since the CMOS type of amplifier is used, consumed current in the entire IC in the band of 16 MHz can be reduced to around 4 $mA_{TYP}$ (8m$A_{TYP}$ in a bipolar) and to around 20 m$A_{TYP}$ in the band of 32 MHz (32 m$A_{TYP}$ in a bipolar).

Figure 4:
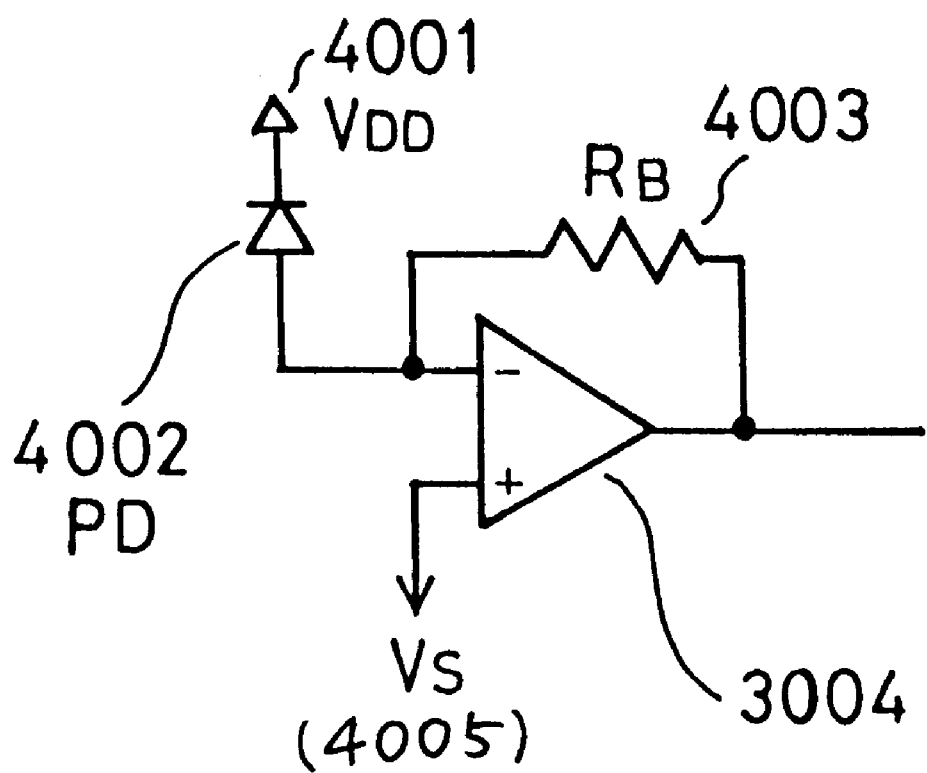
FIG. 4 is a circuit diagram showing a case where PDs (array) in cathode common in the I-V converting stage of the amplifier IC according to Embodiment 1 of the present invention.

FIG. 4 is a circuit diagram showing a case where PDs (array) for cathode-common in the I-V conversion stage of the amplifier IC according to Embodiment 1 of the present invention are arranged therein.

In the figure, designated at the reference numeral 4001 is Vdd, at 4002 a PD, at 4005 $V_s$, at 4003 a feedback resistance $R_B$, and at 3004 a CMOS type of amplifier circuit section according to the present invention. FIG. 3 shows an example of a circuit in connection of a PD array for anode-common (grounding), and the same configuration can be made in connection of the PD array for cathode-common (Vdd). In a case where a PD has a PIN structure, an N type of substrate is more convenient, so that, in a case where an IC is constructed thereby, this type of cathode common is more practical especially in a case where the IC is integrated with a CMOS and a bipolar transistor is not used.

FIG. 5A is a circuit diagram showing a first example of a circuit configuration of a CMOS type amplifier circuit section (differential amplifier) 5016 in the amplifier IC according to Embodiment 1 of the present invention. The CMOS type amplifier circuit has a current mirror type of differential circuit section comprising a PMOS (P channel type of MOS transistor) 1 (5004), a PMOS 2 (5003), an NMOS (N channel type of MOS transistor) 1 (5009), an NMOS 2 (5008), and an NMOS 3 (5013); an output buffer section comprising a PMOS 3 (5005) and an NMOS 4 (5014); an output terminal (Vout) 5010; a Vdd terminal 5001; an input terminal (–) 5002 in series with a gate (G) of the NMOS 2; a GND terminal 5012; an input terminal (+) 5015 in series with a gate (G) of the NMOS 1. Gates (G) of the NMOS 3 (5013) and NMOS 4 (5014) are in series with Vref 5011 [the reference voltage with GND as a reference, FIG. 5B] to obtain a constant current.

A PD 5007 is connected in series with to the input terminal (–) 5002 and is in succession to the output terminal (Vout) 5010 through the feedback resistance $R_B$ (5006). A reference voltage ($V_s$) is supplied to the input terminal (+) 5015. A CMOS type of differential amplifier comprising the circuit as described above is constructed, whereby current consumption can be more largely reduced as compared to that by a bipolar type of differential amplifier based on the conventional technology.

FIG. 5B is a circuit diagram showing one example of a circuit configuration of a reference voltage (Vref) circuit in the CMOS type amplifier circuit section of the amplifier IC according to Embodiment 1 of the present invention.

A reference voltage Vref 5019 can be obtained by connecting an enhancement type NMOS transistor 5018 to a depletion type NMOS transistor 5020 as shown in the figure.

FIG. 5C is a circuit diagram showing a second example of configuration of a circuit a CMOS type of amplifier circuit section 5037 in the amplifier IC according to Embodiment 1 of the present invention. The CMOS type of amplifier circuit section 5037 has a current mirror type differential circuit section comprising a PMOS 1 (5023), a PMOS 2 (5022), an NMOS 1 (5029), and an NMOS 2 (5027); an output buffer section comprising an NMOS 5 (5024), and an NMOS 4 (5030); an output terminal (Vout) 5031; a Vdd terminal 5021; an input terminal (–) 5034 in series with a gate (G) of the NMOS 1; a GND terminal 5036, an input terminal (+) 5028 in series with a gate (G) of the NMOS 2. Gates (G) of the NMOS 3 (5033) and NMOS 4 (5030) are in series with the Vref 5035 [the reference voltage; the same as that in FIG. 5B] to obtain a constant current.

A PD 5032 is in series with the input terminal (–) 5034 and is in series with the output terminal (Vout) 5031 through the feedback resistance $R_B$ (5025). A reference voltage 5026 ($V_s$) is supplied from the outside to the input terminal (+) 5028. There are some differences from the configuration in FIG. 5 A in that a transistor at one edge of the output buffer section is an NMOS (NMOS 5) in place of the PMOS and that the NMOSes 1, 2 in series with the input terminals (–), (+) are transposed respectively. The amplifier IC has the configuration as described above, which makes it possible to eliminate further phase correction in addition to the advantages of the CMOS type of amplifier shown in FIG. 5A.

Figure 6A:
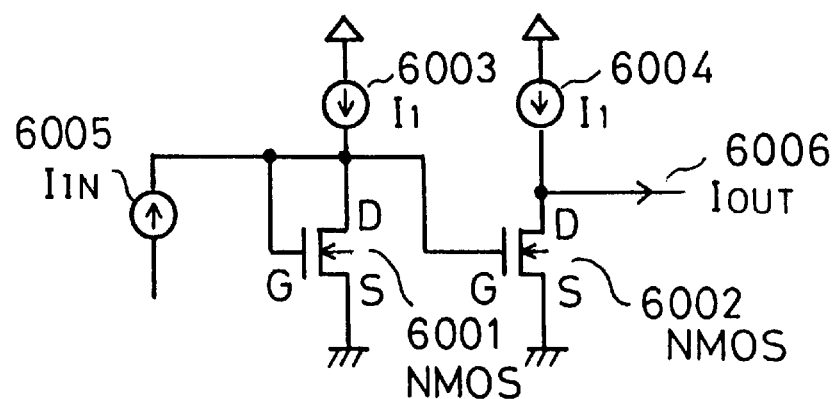
FIGS. 6A and 6B are circuit diagrams showing the current inverter element constituting the amplifier IC according to Embodiment 2 of the present invention.

FIG. 6A, B are circuit diagrams each showing a current inverter element constituting an amplifier IC according to Embodiment 2 of the present invention. There is described hereinafter an example of using a current inverter in place of the CMOS type amplifier circuit section described in Embodiment 1 as one of the components in the amplifier IC according to the present invention, and for description thereof, at first, description is made for basic operations of the current inverter. When constant current source 6003 and 6004 are supplied with the same quantity of a constant current $I_1$ and a current element Iin 6005 is supplied to a gate (G) as well as to a drain (D) of an NMOS 6001, Iout 6006 can be obtained from a drain (D) of an NMOS 6002 having a gate (G) connected in series with the current source 6005. The following expression holds at the point of time: Iout=–Iin.

Figure 6B:
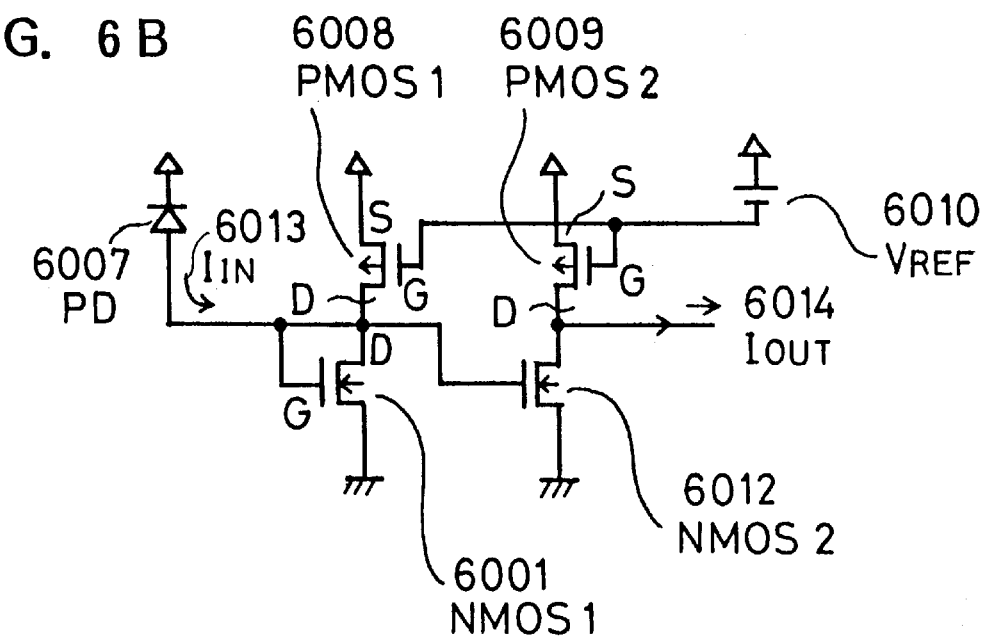

An actual circuit has configuration as shown in FIG. 6 B. Gates (G) of a PMOS 1 (6008) and a PMOS 2 (6009) are in series with a Vref [a reference voltage based on a Vdd reference, the Vref may comprise an enhancement type PMOS and a depletion type thereof in contrast to that described in FIG. 5B] to feed the same quantity of constant current to an NMOS 1 (6011) and an NMOS 2 (6012) respectively, and an input current Iin (6013) is outputted as Iout (–Iin) 6014 from a PD 6007.

Figure 7:
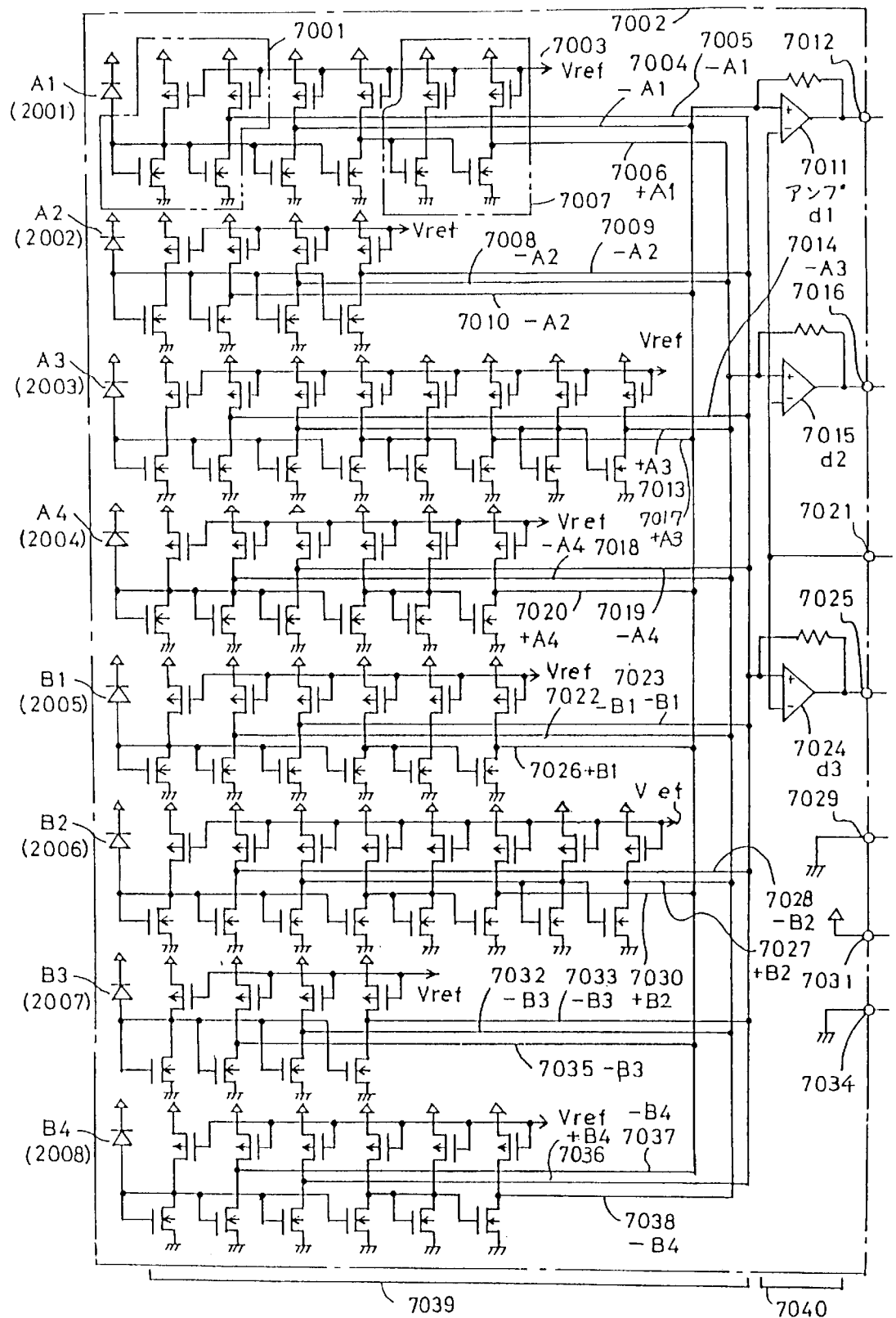
FIG. 7 is a circuit diagram showing the amplifier IC 7002 according to Embodiment 2 of the present invention.

FIG. 7 is a circuit diagram showing the amplifier IC according to Embodiment 2 of the present invention.

The functions (including computation logic of a Focus signal and a Track signal or the like) of the amplifier IC herein are basically the same as those in the amplifier shown in Embodiment 1 shown in FIG. 3, but it is characterized in that the current inverter element described above is used in place of the CMOS type of amplifier circuit as one of the components. Output from the PD 2001 in A1 is taken out as −A1 signal output (current) 7005 through the current inverter element 7001 and is in succession to −A2 (7009), −A3 (7014), −A4 (7019), −B1 (7023), −B2 (7028), −B3 (7033), and −B4 (7037) as shown in the figure each taken out in the same method as described above, namely, after having been subjected to the wired summing operation (as currents before conversion in a summing operation/subtracting operation stage 7039), the current is subjected to polarity inversion as well as to I-V conversion (I-V converting stage 7040) in an amplifier circuit section d3 (7024) to be outputted to an RF signal output terminal 7025 as an RF signal [(A1 +A2+A3+A4)+(B1+B2+B3+B4)]. On the other hand, an A1 signal output (current) through a current inverter 7007 in the other stage is inverted and subjected to I-V conversion in an amplifier circuit section d2 (7015) after wired summing operation as +A1 (7006) is also executed with −A2 (7008), +A3 (7013), −A4 (7018), −B1 (7022), +B2 (7027), −B3 (7032), and +B4 (7036) to be outputted to a Track signal output terminal 7016 as a Track signal [(A2+A4+B1+B3)−(A1+A3+B2+B4)]. Further, a −A1 (7004) of A1 output signal which is the same polarity as that of −A1 (7005) is inverted and I-V converted in the amplifier circuit section d1(7011) after wired sum-computation is executed with −2A(7010), +A3 (7017), +A4 (7020), +B1 (7026), +B2 (7030), −B3 (7035), and −B4 (7034) to be outputted to a Focus signal output terminal 7012 as a Focus signal [(A1+ A2+B3+B4)−(B1+B3+A3+A4)]. Herein, designated at the reference numeral 7003 is a Vref for supplying a PMOS constant current, at 7021 a $V_s$ voltage input terminal, at 7029 a GND terminal, at 7031 a Vdd terminal, and at 7034 a Vss (if necessary) terminal.

As described above, as a result of realization of an amplifier IC in which a summing operation and a subtracting operation (which can be executed based through a wired system) are executed between currents before converted to a voltage with the configuration using a current inverter element and the current is subjected to I-V conversion in the amplifier in the final stage, current consumption can further be reduced as compared to that in Embodiment 1 such as to 16 $mA_{TYP}$ even in the band of 32 MHz. To describe the above process from a different point of view, higher speed can be achieved in a case where the current consumption is the same. In other words, the scheme in which computing for currents is executed first before conversion and then I-V conversion is executed in the final last stage is an important feature of the present invention. In addition, the most effective result of all was the possibility to substantially reduce the size of a chip. The chip area can be reduced by 30% or more as compared to that in Embodiment 1.

As for a logic (operation) of computing Focus signals or Track signals, various cases are conceivable as to how the PD array is to be arranged or how many numbers of PD are to be provided.

Some examples have been introduced in Embodiments 1 and 2. However, it is needless to say that the essence of the technology disclosed herein is sufficiently effective and applicable even if the number of PDs are changed or computation logic is changed. Also, the description above assumed apickup section in a CD-ROM drive as an example, but however, it is clear that the present invention is also effective in a light-spot positional detection in an auto-focus device of a camera.

Figure 8:
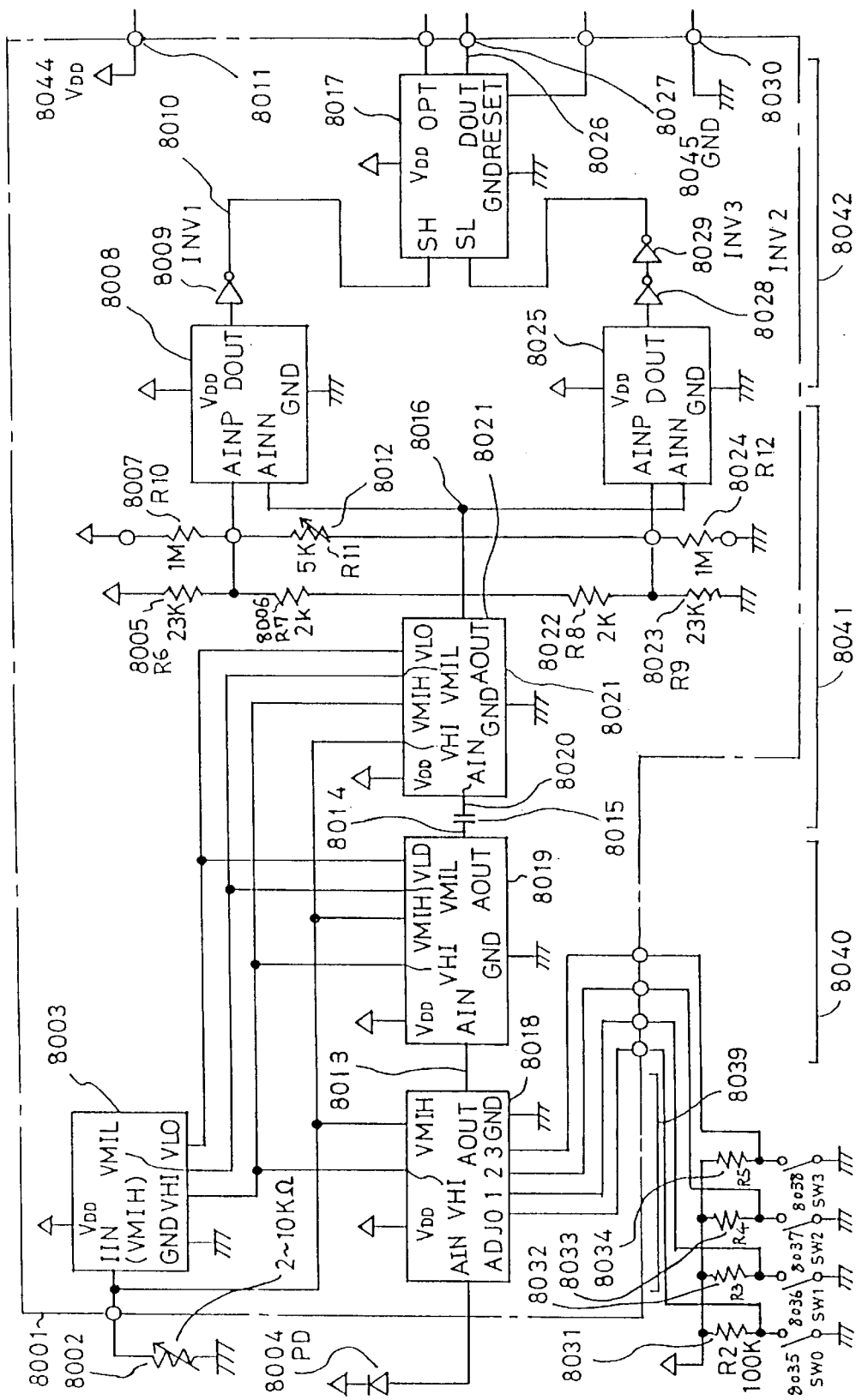
FIG. 8 is a system block diagram showing a current 8001 per 1$^{ch}$ of the amplifier IC according to Embodiment 3 of the present invention.

FIG. 8 is a system block diagram showing a circuit 8001 per $1^{ch}$ (one channel; $1^{ch}$ means per one PD) of an amplifier IC according to Embodiment 3 of the present invention.

The circuit has a summing operation/subtracting operation stage 8039 for currents before conversion (in a case of a plurality of channels provided therein, computing is possible, but herein description is made therefor with $1^{ch}$, a single channel in the embodiment, so that the computing can be executed in the same configuration as that in Embodiment 2) comprising a stage 1 circuit section (comprising a first stage amplifier section, a current inverter, and a gain control or the like) 8018 to which a signal is inputted from a PD 8004; an I-V converting stage 8040 comprising a stage 2 circuit section (I-V conversion amplifier) 8019; a differentiating waveform circuit stage 8041 comprising each of input sides of a capacitor for signal differentiation (2.0 pF) 8015, a stage 3 circuit section (transimpedance amplifier) 8021, stage 4 circuit sections (analog waveform→digital waveform, comparator) 8008 (leading edge detection comparator section) and 8025 (falling edge detection comparator section); a digital circuit stage 8042 comprising the output sides of the stage 4 circuit sections 8008 and 8025, a plurality of logic gate circuit section (inverters: INV1 (8009), INV2 (8028), INV3 (8029)) and a stage 5 (output buffer section) 8017; and a bias control circuit section 8003 having a function of concurrently acting on the stage 1 circuit section, the stage 2 circuit section, and the stage 3 circuit section. In the figure, designated at the reference numeral 8002 is an external resistance R1 (Iref: Rref for deciding current consumption, adjusted in a range from 2 to 10 K Ω), at 8031 to 8034 external resistances R1 to R5 (any of them has 100 K Ω) for gain control, at 8035 to 8038 external bit-selection switches (SW) for gain control. Designated at the reference numeral 8005 is a resistance R6 (23 K Ω), at 8006 a resistance R7 (2 K Ω), at 8022 a resistance R8 (2 K Ω), at 8023 a resistance R9 (23 K Ω), at 8007 an external resistance R10 (1 M Ω), at 8012 an external resistance R11 (0 to 5 K Ω a potentiometer), at 8024 an external resistance R12 (1 M Ω), at 8027 an output terminal, at 8011 a Vdd terminal (8044 is Vdd), and at 8030 a GND terminal (8045 is a GND) [the Vdd and GND, as described above, may comprise a plurality of power supply units such as an analog Vdd, a digital Vdd, an analog GND, and a digital Vss depending on system configuration].

FIG. 9 is a simulated view showing signal voltage waveforms at each of a node 2 (8014) (a node 1 (8013) may also be considered to be the same although it is a current from a qualitative point of view), a node 3 (8020) (a node 4 (8016) may also be considered to be the same from a qualitative point of view), a node 5 (8010), a node 6 (8030), and a node 7 (8026) (=an output terminal waveform) in FIG. 8 of the amplifier IC according to Embodiment 3 of the present invention. The X-axis is a time axis. The voltage waveform at the node 2 becomes the waveform shown at node 3 by being passed through the differentiating circuit, and it is possible to obtain the digital waveforms obtained by fetching only a leading edge and a falling edge of the original waveform like that at the node 5 and node 6 by being passed through the comparator circuit sections 8008 and 8025 specifying TH High (upper side of the threshold) and TH Low (lower side of the threshold) respectively.

Further, it is possible to obtain the waveform (demodulated to a rectangular waveform) at the node 7 by being passed through the logic gate circuit section in the stage 5. The waveform processing has the configuration as described above, although detailed description is made later for each of circuit sections, whereby it is possible to suppress amplification of noises and offset elements each close to a DC current element in an input waveform.

Namely, the S/N ratio does not become lower even if a bias current is restricted in each of the amplifier circuit sections, and further, lower current consumption can be achieved (reversely, a high-speed operation can further be achieved). In this case, 1. 25 mA$_{TYP}$ per channel in the band of 30 MHz can be obtained (around 10 mA obtained by multiplying by 8 as compared to that in the description up to Embodiment 2 may be considered). In a case where a summing operation or a subtracting operation for a plurality of PD signals as described in the First and Second embodiments is executed, it is needless to say that the computing may also be executed by the current inverter in the stage 1, but, when summing all signals such as for instance, RF signals, lower current consumption can also be achieved even if such configuration, in which the computing is executed at the digital stage and thereafter and on, may be employed.

FIG. 10 is a circuit diagram showing a bias control circuit section 10002 in the amplifier IC according to Embodiment 3 of the present invention. In the figure, designated at the reference numeral 10004 is a PMOS [it is indicated that W/L (Width/Length of a gate) is 100/1.4 $\mu$m, and is abbreviated hereinafter just as "100/1.4"], at 10007 a PMOS (100/1.4), at 10003 a PMOS (100/1.4), at 10006 a PMOS (100/1.4), at 10010 an NMOS (40/3.6), at 10012 an NMOS (40/1.2), at 10008 an I IN (VMIH) terminal, at 10005 a VHI (output) terminal, at 10009 a VMI (output) terminal, at 10011 a VLO (output) terminal, at 10001 a Vdd terminal, and at 10013 a GND terminal.

By employing a circuit having the configuration as described above, each bias (in a relation VMIH with VHI, VMI, and VLO) is controlled to prevent the amplifier in the stage 2 and stage 3 circuit sections from being saturated with a DC current element.

Figure 11:
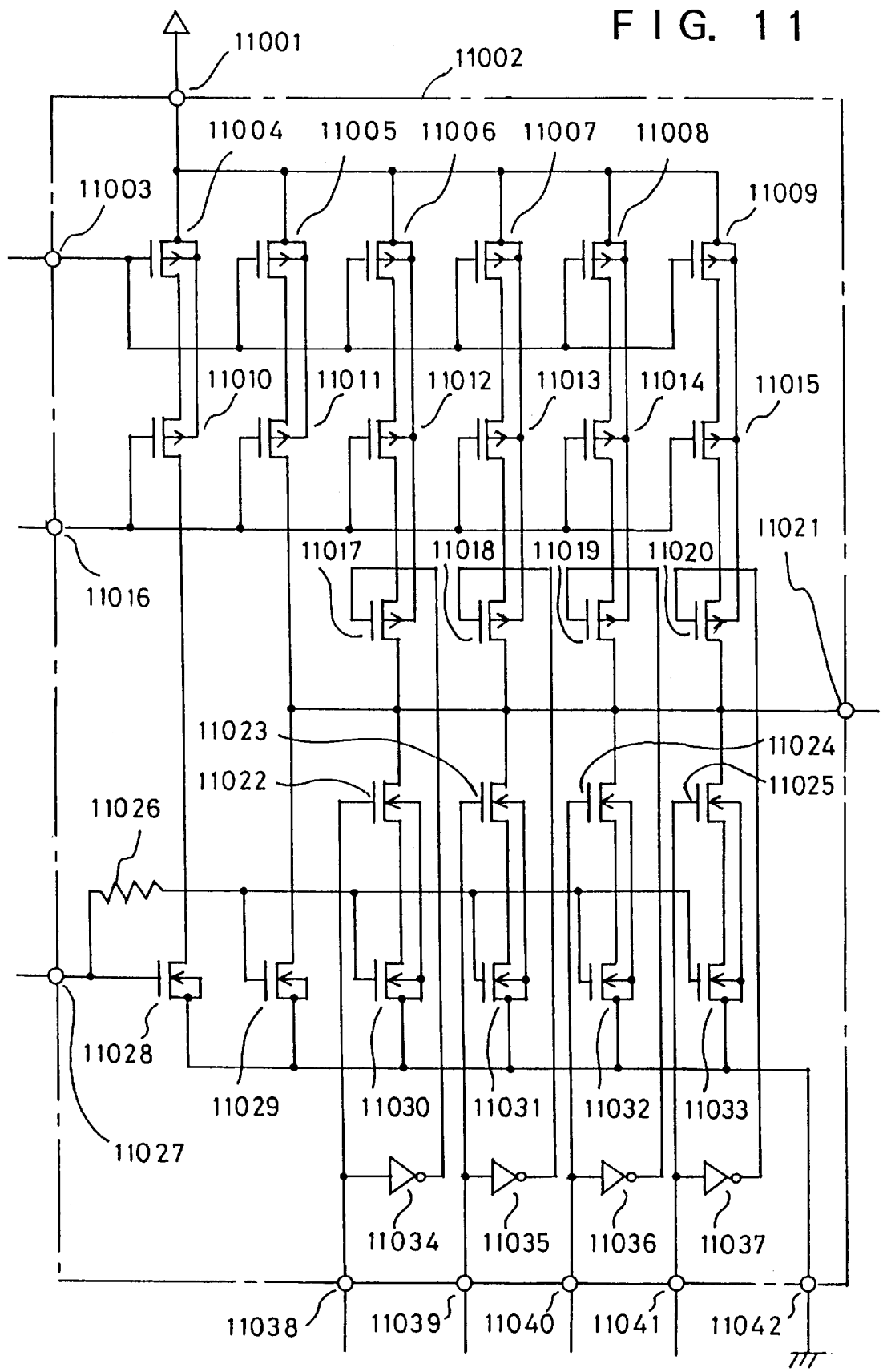
FIG. 11 is a circuit diagram showing the stage 1 circuit section 11002 in the amplifier IC according to Embodiment 3 of the present invention.

FIG. 11 is a circuit diagram showing a stage 1 circuit section (a current inverter+gain control) 11002 in the amplifier IC according to Embodiment 3 of the present invention.

In the figure, designated at the reference numeral 11004 a PMOS (64/1.4), at 11005 a PMOS (12/1.4), at 11006 a PMOS (12/1.4), at 11007 a PMOS (22/1.4), at 11008 a PMOS (45/1.4), at 11009 a PMOS (90/1.4), at 11010 a PMOS (64/1.4), at 11011 a PMOS (12/1.4), at 11012 a PMOS (12/1.4), at 11013 a PMOS (22/1.4), at 11014 a PMOS (45/1.4), at 11015 a PMOS (90/1.4), at 11017 a PMOS (12/1.4), at 11018 a PMOS (22/1.4), at 11019 a PMOS (45/1.4), at 11020 a PMOS (90/1.4), at 11022 is an NMOS (32/2), at 11023 an NMOS (64/2), at 11024 an NMOS (128/2), at 11025 an NMOS (256/2), at 11028 an NMOS (256/2), at 11029 an NMOS (32/2), at 11030 an NMOS (32/2), at 11031 an NMOS (64/2), at 11032 an NMOS (128/2), at 11033 an NMOS (256/2), at 11034 an inverter (INV, and Vdd and GND in the logic gate group are omitted hereinafter) of a logic gate, at 11035 an INV, at 11036 an INV, at 11037 an INV, at 11026 a feedback reference RF (20 K $\Omega$), at 11003 a VHI (input) terminal, at 11016 a VMIH (input) terminal, at 11027 an AIN (signal input from a PD) terminal, at 11038 an ADJ0 terminal, at 11039 an ADJ1 terminal, at 11040 an ADJ2 terminal, at 11041 an ADJ3 terminal, at 11042 a GND terminal, at 11021 an AOUT (output) terminal, and 11001 a Vdd terminal. Cascode connection controlled by the VHI and VMIH is provided to PMOSes 11004 to 11015 each for a constant current, so that they can be used at high impedance. When the switches SW 8035 to 8038 are in a state (OFF) shown in FIG. 8, all the NMOSes 11030 to 11033 in FIG. 11 can operate, but when all the switches SW 8035 to 8038 are turned ON, only the NMOS 11029 will operate as a current inverter. The current inverter has the configuration as described above, which can make the stage 1 circuit section have not only transimpedance but also a gain-variable amplifying function. Accordingly, it is possible to adjust a gain in a current inverter according to application (light strength), and for this reason, the amplifier IC can correspond to a wide dynamic range thereof.

FIG. 12 is a circuit diagram showing a differential amplifier 12002 constituting the stage 2 circuit section (I-V converting amplifier) and stage 3 circuit section (transimpedance amplifier) in the amplifier IC according to Embodiment 3 of the present invention.

In the figure, designated at the reference numeral 12004 is a PMOS (50/1.4), at 12006 a PMOS (50/1.4), at 12012 an NMOS (128/2), at 12011 an NMOS (128/2), at 12014 an NMOS (80/1.2), at 12007 a feedback resistance RF (20 K $\Omega$), at 12003 a VHI (input) terminal, at 12005 a VMIII (input) terminal, at 12009 an AIN (input) terminal, at 12010 a VMIL (input) terminal, at 12013 a VLO (input) terminal, at 12015 a GND terminal, at 12008 an AOUT (output) terminal, and at 12001 a Vdd terminal.

Figure 13:
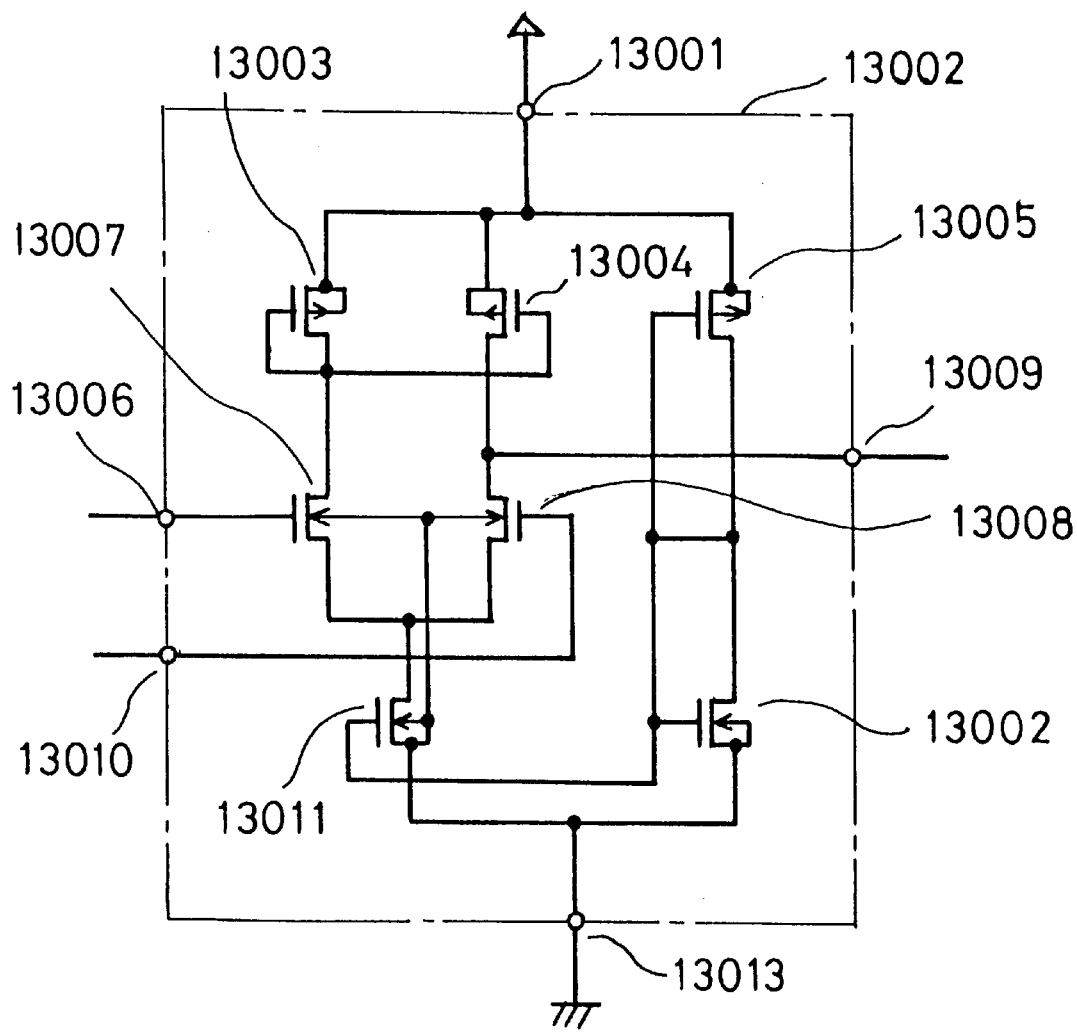
FIG. 13 is a circuit diagram showing the comparator constituting the stage 4 circuit sections 8008 and 8025 in the amplifier IC according to Embodiment 3 of the present invention.

FIG. 13 is a circuit diagram showing a comparator constituting the stage 4 circuit sections 8008 and 8025 in the amplifier IC according to Embodiment 3 of the present invention. In the figure, designated at the reference numeral 13003 is a PMOS (36/4.2), at 13004 a PMOS (30/4.2), at 13005 a PMOS (36/4.2), at 13007 an NMOS (24/1.2), at 13008 an NMOS (24/1.2), at 13011 an NMOS (24/3.6), at 13012 an NMOS (12/3.6), at 13006 an AINP (input) terminal, at 13010 an AINN (input) terminal, at 13013 a GND terminal, at 13009 a DOUT (output) terminal, and at 13001 a Vdd terminal.

Figure 14:
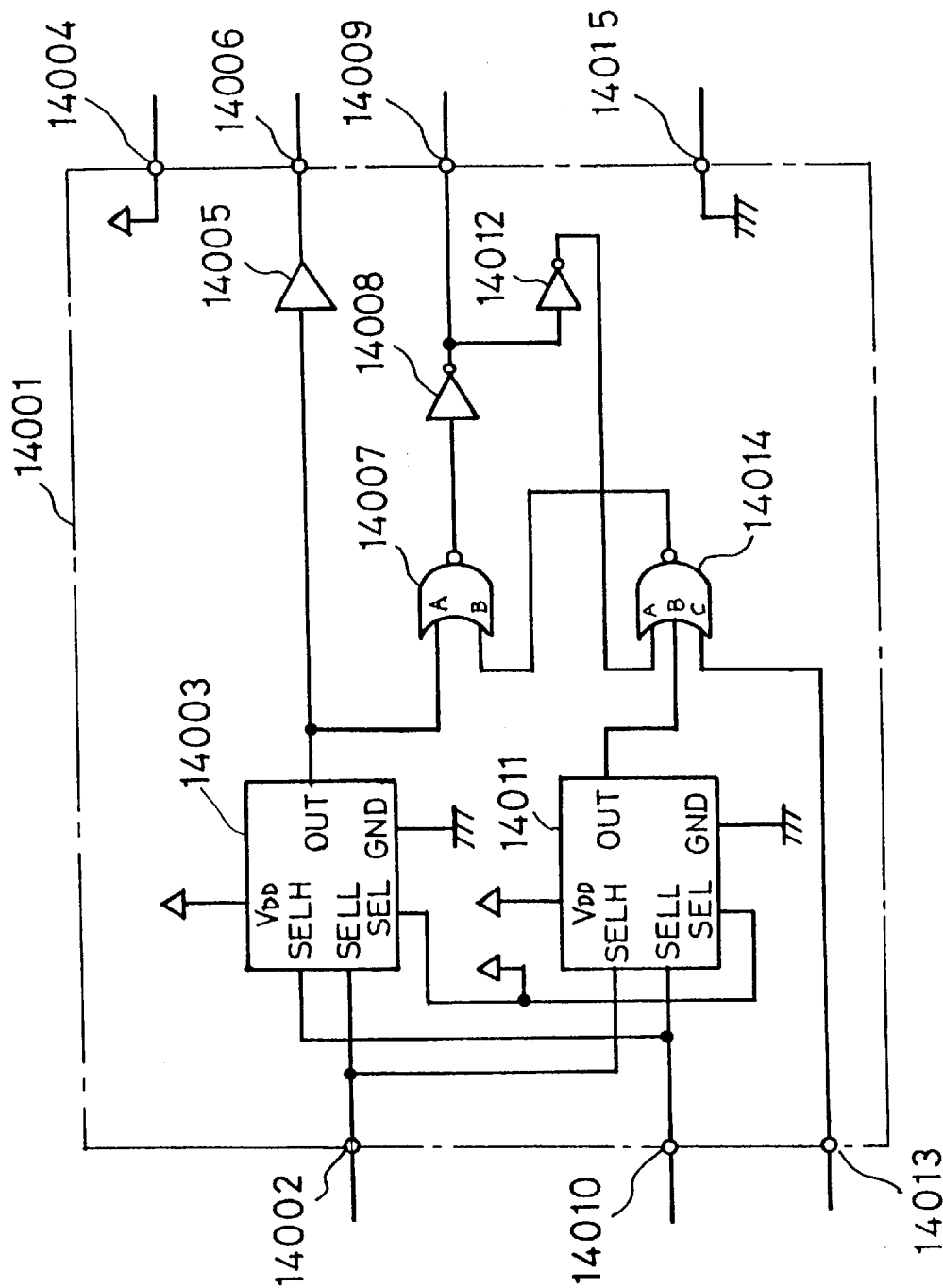
FIG. 14 is a circuit diagram showing the output buffer section 14001 constituting the stage 5 circuit section in the amplifier IC according to Embodiment 3 of the present invention.

FIG. 14 is a circuit diagram showing an output buffer section 14001 constituting the stage 5 circuit section in the amplifier IC according to Embodiment 3 of the present invention. In the figure, designated at the reference numeral 14003 and 14011 are MUX circuit sections (described later in detail), at 14005 a buffer (BUF), at 14007 an NOR gate, at 14008 and 14012 inverters, at 14002 an SH (input) terminal, at 14010 an SL (input) terminal, at 14013 a RESET (input) terminal, at 14007 and at 14014 NOR gates, at 14015 a GND terminal, at 14009 a DOUT (output) terminal, at 14006 an OPT (output) terminal, and at 14004 a Vdd terminal. Description of the Vdd and GND in the logic gate group is omitted in the figure.

Figure 15:
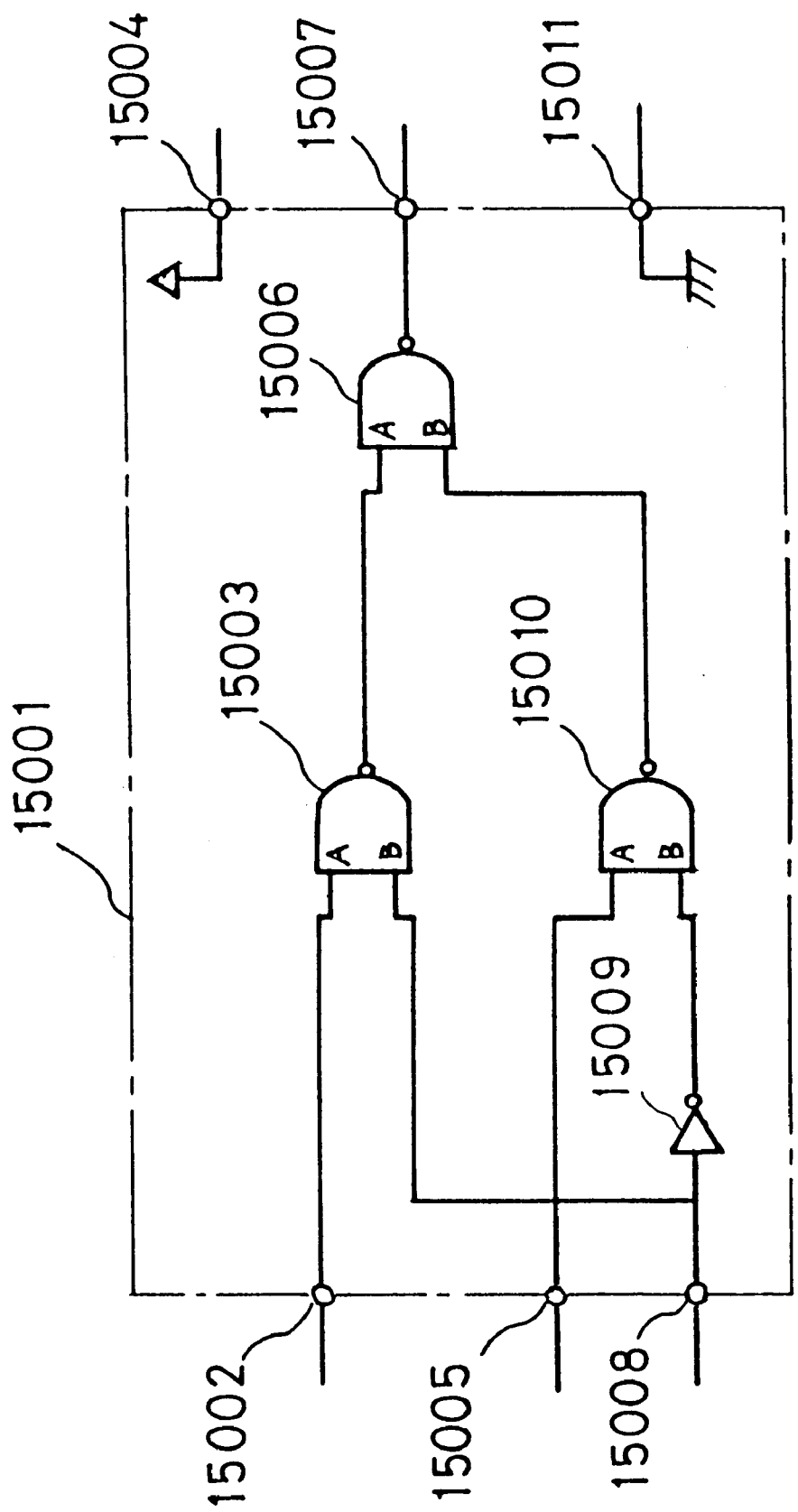
FIG. 15 is a circuit diagram showing the MUX circuit section 15001 inside the stage 5 circuit section in the amplifier IC according to Embodiment 3 of the present invention.

FIG. 15 is a circuit diagram showing a MUX circuit section 15001 in the stage 5 circuit section in the amplifier IC according to Embodiment 3 of the present invention. In the figure, designated at the reference numeral 15003, 15006, 15010 are NAND gates, at 15009 an inverter, at 15002 an SELH (input) terminal, at 15005 an SELL (input) terminal, at 15008 an SEL (input) terminal, at 15011 a GND terminal, at 15007 an OUT terminal, and at 15004 a Vdd terminal.

Figure 16:
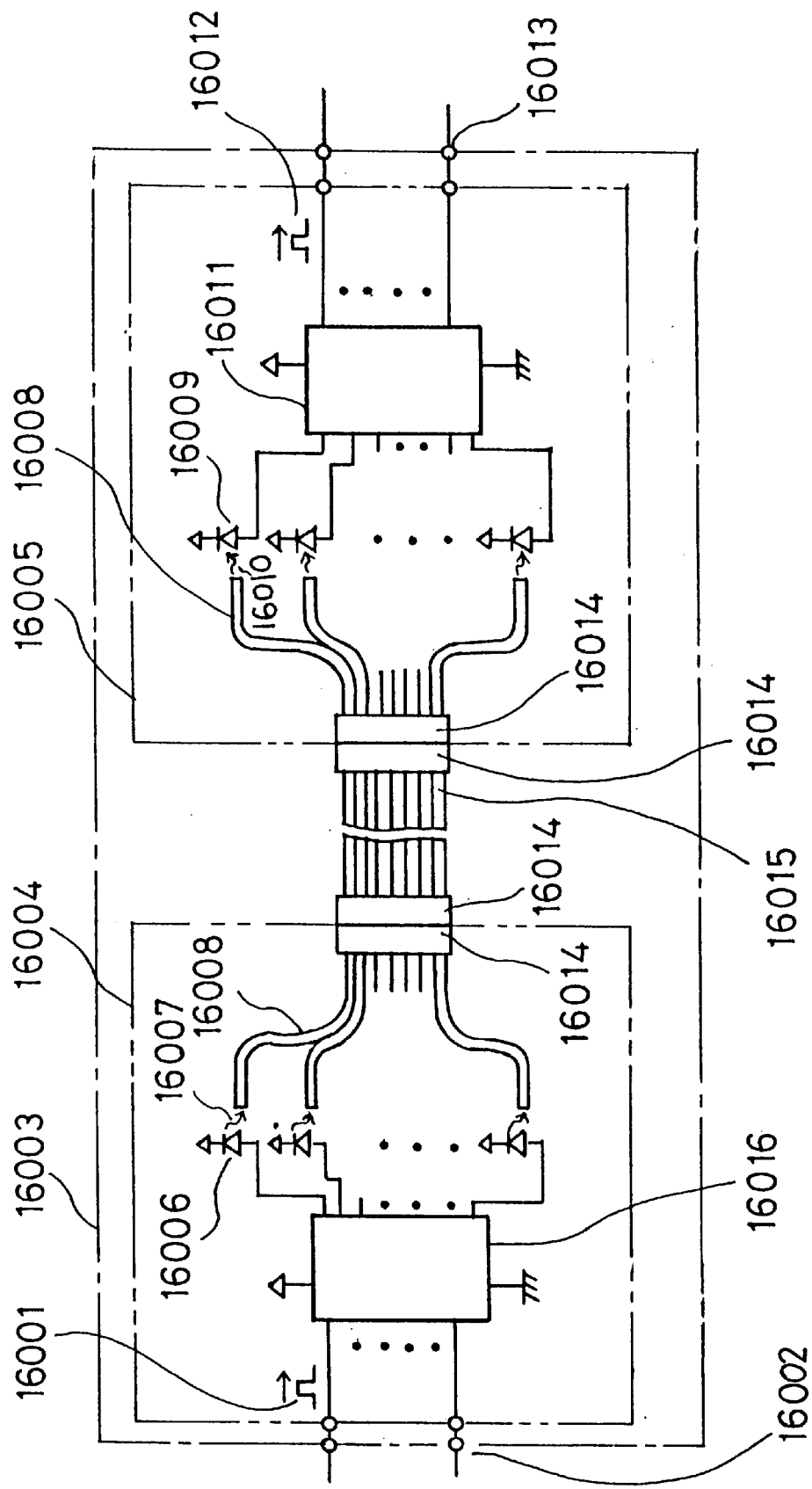
FIG. 16 is a system block diagram showing the optical-fiber communication cable module 16003 using the amplifier IC according to Embodiment 3 of the present invention.
Figure 18:
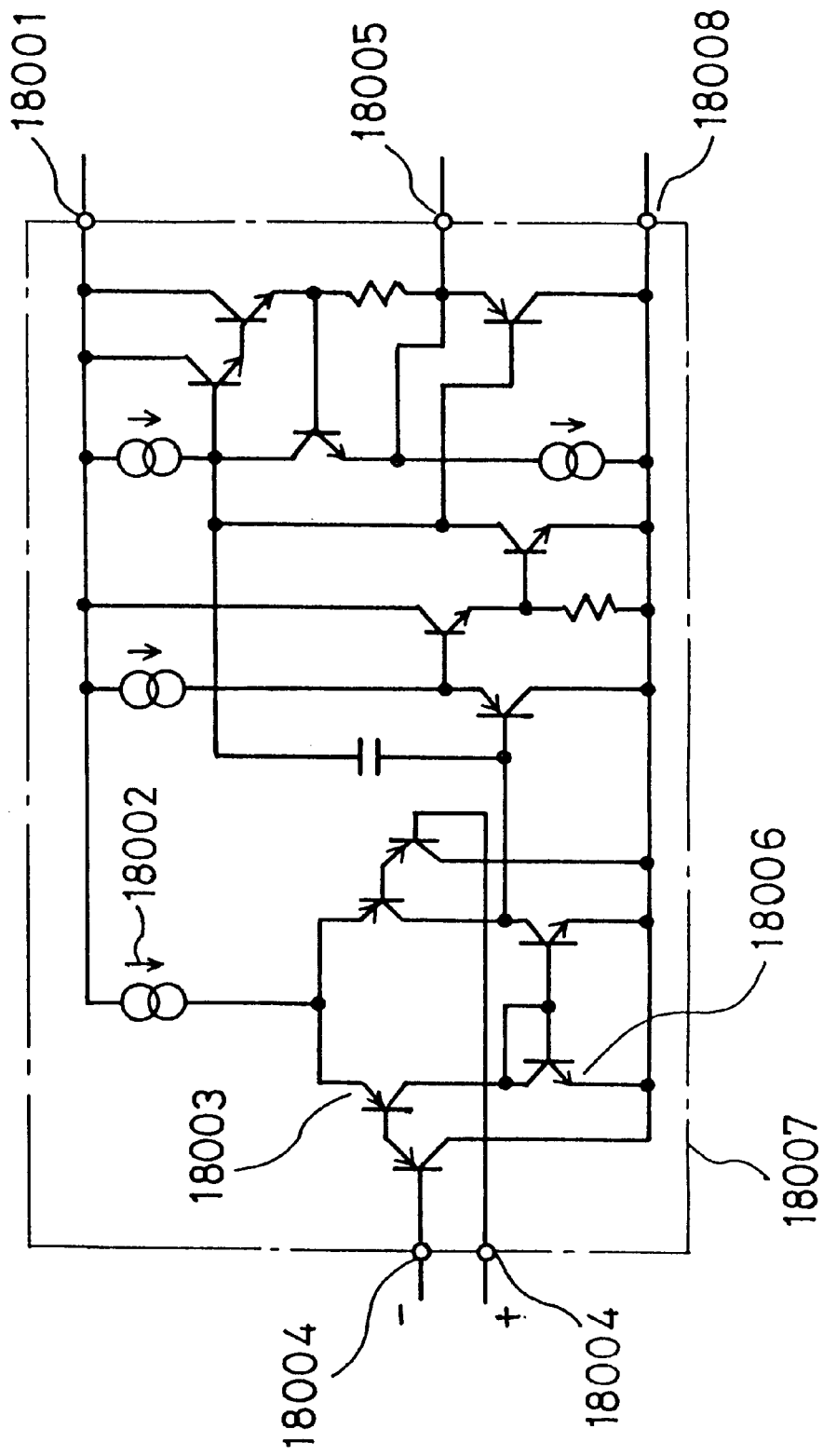
FIG. 18 is an example based on the conventional technology of the internal circuit in the differential amplifier (amplifier) shown in FIG. 17.

FIG. 16 is a system block diagram showing an optical-fiber communication cable module 16003 using the amplifier IC according to Embodiment 3 of the present invention. In the figure, designated at the reference numeral 16004 is a transmission module section, at 16005 a receiving module section, at 16001 an input digital signal, at 16006 a light-emitting diode (LED), at 16007 an emitting light, at 16008 an optical fiber cable, at 16010 an incident light, at 16009 a PD, at 16011 amplifier ICs, according to Embodiment 3 of the present invention, integrated corresponding to a plurality of channels, at 16012 an output digital signal, at 16002 an input signal, at 16016 an LED driver IC, at 16014 a light connector section, at 16015 an optical fiber bundle cable (e.g. ten lines of optical fibers are bundled), and at 16013 an output terminal. The amplifier IC according to Embodiment 3 of the present invention is effective when it is used for a system in which base band signals in a single mode are used for being arranged in multi-channels (a plurality of channels), but it is needless to say that it is also effective even to be used for a summing operation/subtracting operation of a PD array as described in the first and second embodiment.

As described above, with the present invention, it is possible to realize the highest performance and lowest cost amplifier IC ever manufactured in the semiconductor integrated circuit device (amplifier IC) in which an output current from a photodiode is converted to a voltage to be outputted.

What is claimed is:

1. A semiconductor integrated circuit device comprising: a first amplifying circuit for amplifying an input signal; a second amplifying circuit connected via a resistance element in series to the first amplifying circuit; a third amplifying circuit connected in series to the second amplifying circuit; and a substrate on which each of the first, second and third amplifying circuits are provided; wherein each of the first, second, and third amplifying circuits is configured as an inverting amplifier comprising a CMOS circuit, and two layers of NMOS circuit elements are provided at an output stage of each inverting amplifier.

2. A semiconductor integrated circuit device according to claim 1; wherein the first, second and third amplifying circuits each comprise a differential amplifier.

3. A semiconductor integrated circuit device according to claim 1; wherein the first, second and third amplifying circuits each comprise a preamplifier.

4. A semiconductor integrated circuit device according to claim 1; wherein the first, second and third amplifying circuits each comprise a front-end amplifier.

5. A semiconductor integrated circuit device according to claim 1; wherein the first, second and third amplifying circuits each comprise an operational amplifier.

6. A semiconductor integrated circuit device according to claim 1; further comprising a light emitting element for emitting light to an optical data storage medium, a reflector for reflecting the emitted light onto an encoded portion of the optical data storage medium, and an optical element having a light receiving portion for receiving light reflected back from the optical data storage medium and projecting said received light onto a light detecting element.

7. A semiconductor integrated circuit device according to claim 6; wherein the light emitting element comprises a laser.

8. A semiconductor integrated circuit device according to claim 6; wherein the optical element comprises a prism, and the reflector comprises a slanted portion of the prism onto which the emitted light is projected so that the emitted light is reflected onto the optical data storage medium.

9. A semiconductor integrated circuit device according to claim 6; wherein the light detecting element comprises a photodiode array.

10. A semiconductor integrated circuit device according to claim 9; wherein a plurality of sets of the first, second and third amplifying circuits are provided, each set for receiving an output of a respective photodiode of the photodiode array, and outputs of the respective sets of first, second and third amplifying circuits are combined to produce a signal representing data stored on the optical data storage medium.

11. A semiconductor integrated circuit device according to claim 1; further comprising a photoelectric transfer element formed on the substrate for converting incident light to an electric signal, the electrical signal output of the photoelectric transfer element being input to the first amplifying circuit.

12. A semiconductor integrated circuit device according to claim 11; wherein the photoelectric transfer element comprises a photodiode.

13. A semiconductor integrated circuit device according to claim 12; wherein the photoelectric transfer element comprises a photodiode array.

14. A semiconductor integrated circuit device according to claim 13; further comprising a light emitting element for emitting light to an optical data storage medium, a reflector for reflecting the emitted light onto an encoded portion of the optical data storage medium, and an optical element having a light receiving portion for receiving light reflected back from the optical data storage medium and projecting said received light onto the photodiode array.

15. A semiconductor integrated circuit device according to claim 14; wherein the light emitting element comprises a laser.

16. A semiconductor integrated circuit device according to claim 15; wherein the optical element comprises a prism, and the reflector comprises a slanted portion of the prism onto which the emitted light is projected so that the emitted light is reflected onto the optical data storage medium.

17. A semiconductor integrated circuit device according to claim 16; wherein the photodiode array comprises a front photodiode array arranged adjacent the slanted portion of the prism and a rear photodiode array arranged adjacent a side of the front photodiode array opposite a side adjacent to the prism.

18. A semiconductor integrated circuit device according to claim 17; further comprising a light detector for receiving a portion of the emitted light and producing an output signal indicating the strength of the emitted light.

19. A semiconductor integrated circuit device according to claim 17; wherein photodiodes in the front photodiode array and the rear photodiode array are arranged in rows comprising one or more small photodiodes in the center of each row and a pair of larger photodiodes at opposite sides of the small photodiodes, so that a spot size of a beam of reflected light incident on a row of photodiodes can be determined based on a strength of an electrical output signal from the photodiodes formed in the rows.

20. A semiconductor integrated circuit device according to claim 19; wherein a plurality of sets of the first, second and third amplifying circuits are provided, each set for receiving an output of a respective photodiode of the photodiode array, and outputs of the respective sets of first, second and third amplifying circuits are combined to produce a signal representing data stored on the optical data storage medium.

21. A semiconductor integrated circuit device according to claim 20; wherein outputs of the respective sets of first, second and third amplifying circuits are combined to produce a signal representing spot size of a beam of reflected light incident on the rows of photodiodes based on a strength of an electrical output signal from the photodiodes, so that focus of the beam of reflected light can be determined.

22. A semiconductor integrated circuit device comprising: a substrate; a current inverting circuit formed on the substrate; a current to voltage circuit for converting a current to a voltage connected in series with the current inverting element, the current inverting element and the circuit element being provided on the same substrate; wherein the current inverting element comprises a first P channel MOS transistor, a second P channel MOS transistor, a first N channel MOS transistor having a drain connected to a drain of the first P channel MOS transistor, and a second N channel MOS transistor having a drain connected to a drain of the second P channel MOS transistors, a gate of the first N channel MOS transistor being connected to the drain thereof, and a gate of the second N channel MOS transistor being connected to a drain of the first N channel MOS transistor.

23. A semiconductor integrated circuit device according to claim 22; further comprising a photoelectric transfer element for converting light to an electric signal provided on the same substrate as the current inverting circuit and the current to voltage circuit.

24. A semiconductor integrated circuit device according to claim 22; further comprising a third P channel MOS transistor connected in series between the first P channel MOS transistor and the first N channel MOS transistor, and a fourth P channel MOS transistor connected in series between the second P channel MOS transistor and the second N channel MOS transistor; wherein the first and third P channel MOS transistors form a cascode connection and the second and fourth P channel MOS transistors form a cascode connection.

25. A semiconductor integrated circuit device according to claim 22; further comprising a differential amplifier in series with the current to voltage circuit, and a capacitor provided in series between the current to voltage circuit and the differential amplifier.

26. A light pickup device comprising: a substrate; an optical prism provided on the substrate; a photodiode device disposed at one edge of the substrate; a laser-emitting diode provided on the substrate; a current inverting element provided on the substrate; and a current inverting circuit for converting a current to a voltage, the current inverting circuit comprising a first P channel MOS transistor, a second P channel MOS transistor, a first N channel MOS transistor having a drain connected to a drain of the first P channel MOS transistors, and a second N channel MOS transistor having a drain connected to a drain of the second P channel of MOS transistor, a gate of the first N channel MOS transistor being connected to drain thereof, and a gate of the second N channel MOS transistor being connected to a drain of the first N channel MOS transistor.

27. An optical fiber cable connector device comprising: a substrate an optical fibers; a photodiode; and a semiconductor integrated circuit device formed on the substrate, the semiconductor integrated circuit device comprising a current inverting circuit formed on the substrate and a current to voltage circuit for converting a current to a voltage connected in series with the current inverting circuit, the current inverting circuit comprising a first P channel MOS transistor, a second P channel MOS transistor, a first N channel MOS transistor having a drain connected to a drain of the first P channel MOS transistor, and a second N channel MOS transistor having a drain connected to a drain of the first P channel MOS transistor, a gate of the first N channel MOS transistor being connected to the drain thereof, and a gate of the second N channel MOS transistor being connected to a drain of the first N channel MOS transistor.

28. A photoelectric converter circuit comprising: a substrate; a photoelectric element for converting light into an electric signal provided on the substrate; a first differential amplifier coupled to the photoelectric element; a resistor coupled to the first differential amplifier; a second differential amplifier coupled to the resistor; and a third differential amplifier coupled to the second differential amplifier; wherein the first differential amplifier, the second differential amplifier, and the third differential amplifier each comprise a CMOS inverting amplifier.

29. A photoelectric converter circuit according to claim 28; wherein each inverting amplifier comprises a current mirror type differential amplifier, a first MOS transistor coupled to an output of the current mirror type differential amplifier, and a second MOS transistor having an output coupled to a drain of the first MOS transistor.

30. A photoelectric converter circuit comprising: a photoelectric element for converting light into an electric signal; and a current inverting element coupled to the photoelectric converter element; wherein the current inverting element comprises a first MOS transistor, a second MOS transistor, a third MOS transistor having a drain and a gate coupled to the first MOS transistor, a fourth MOS transistor having a drain and a gate coupled to the second MOS transistor, the fourth MOS transistor having a gate coupled to the third MOS transistor.

31. A photoelectric converter circuit according to claim 30; further comprising a current to voltage converting circuit connected to an output of the current inverting element.

32. A photoelectric converter circuit comprising: a substrate; a photoelectric converter element for converting light into an electric signal provided on the substrate; a current inverting element coupled the photoelectric converter element; a current to voltage converting circuit coupled an output of the current inverting element; a differential amplifier coupled an output of the current to voltage converting circuit; and a capacitor connected in series between the current to voltage converting circuit and the differential amplifier.

33. A photoelectric converter as claim 32; wherein the current inverting element comprises a first MOS transistor, a second MOS transistor, a third MOS transistor connected to form a cascode connection with the first MOS transistor, a fourth MOS transistor connected to form a cascode connection with the second MOS transistor, a fifth MOS transistor connected in series to the second MOS transistor, and a sixth MOS transistor connected in series to the fourth MOS transistor.

34. A light pickup device comprising: an optical prism; a laser-emitting diode semiconductor device; a photodiode semiconductor device for converting light output by the laser-emitting diode semiconductor device into an electric signal; a first differential amplifier coupled to the photodiode semiconductor device; a second differential amplifier coupled to the first differential amplifier; and a third differential amplifier coupled to the second differential amplifier; wherein the first differential amplifier, the second differential amplifier, and the third differential amplifier each comprise a CMOS type inverting amplifier.

35. A light pickup device comprising: an optical prism; a laser-emitting diode semiconductor device; a photodiode semiconductor device for converting light output by the laser-emitting diode semiconductor device into an electric signal; a current inverting element coupled to the photodiode semiconductor device; and a current to voltage converting circuit coupled to the current inverting element; wherein the current inverting element comprises a first MOS transistor, a second MOS transistor, a third MOS transistor having a drain and gate coupled to a drain of the first MOS transistor, a fourth MOS transistor having a drain coupled to a drain of the second MOS transistor and a gate coupled to a drain of the third MOS transistor.

36. A light pickup device comprising: an optical prism; a laser emitting diode semiconductor device; a photodiode semiconductor device for converting light output by the laser-emitting diode semiconductor device into an electric signal; and a current inverting element coupled to the photodiode semiconductor device; wherein the current inverting element comprises a first MOS transistor, a second MOS transistor, a third MOS transistor connected to the first MOS transistor to form a cascode connection, a fourth MOS transistor connected to the second MOS transistor to form a cascode connection, a fifth MOS transistor coupled in series to the second MOS transistor, and a sixth MOS transistor coupled in series to the fourth MOS transistor.

* * * * *